United States Patent [19]

Morimoto et al.

[11] Patent Number: 5,668,733
[45] Date of Patent: Sep. 16, 1997

[54] SUBSTRATE PROCESSING APPARATUS AND METHOD

[75] Inventors: Toru Morimoto; Kenji Hashinoki; Tetsuya Hamada; Kenji Kamei, all of Kyoto, Japan

[73] Assignee: Dainippon Screen Mfg. Co., Ltd., Japan

[21] Appl. No.: 417,800

[22] Filed: Apr. 6, 1995

[30] Foreign Application Priority Data

Apr. 8, 1994 [JP] Japan .................................. 6-071036

[51] Int. Cl.⁶ .................................................. G06F 19/00
[52] U.S. Cl. .................. 364/488; 364/468.01; 414/222; 414/273
[58] Field of Search .......................... 364/488, 468; 414/222, 273

[56] References Cited

U.S. PATENT DOCUMENTS

| | | | |
|---|---|---|---|
| 4,278,366 | 7/1981 | Loveless et al. | 406/88 |
| 4,825,808 | 5/1989 | Takahashi et al. | 118/719 |
| 4,909,695 | 3/1990 | Hurwitt et al. | 414/217 |
| 5,067,218 | 11/1991 | Williams | 29/25.01 |
| 5,100,276 | 3/1992 | Iwasaki et al. | 414/222 |
| 5,164,034 | 11/1992 | Arai et al. | 156/345 |
| 5,164,905 | 11/1992 | Iwasaki et al. | 364/468.19 |
| 5,308,210 | 5/1994 | Ohtani et al. | 414/222 |
| 5,436,848 | 7/1995 | Nishida et al. | 364/468.19 |
| 5,442,416 | 8/1995 | Tateyama et al. | 396/612 |
| 5,536,128 | 7/1996 | Shimoyashiro et al. | 414/273 |

FOREIGN PATENT DOCUMENTS 4-113612  4/1992  Japan .

*Primary Examiner*—Kevin J. Teska
*Assistant Examiner*—N. L. Dehlitsch-Moats
*Attorney, Agent, or Firm*—Ostrolenk, Faber, Gerb & Soffen, LLP

[57] ABSTRACT

Substrates of a precedent lot are transported among first processing parts while being processed by the first processing parts. The circulating transportation for the precedent lot is interrupted after starting of the circulating transportation of the first substrate of the precedent lot before starting of the circulating transportation of the last substrate of the precedent lot. Thereafter, a substrate of a subsequent lot is transported among second processing parts while being processed by the second processing parts. Hence, processing of the substrates of the precedent and subsequent lots are concurrently processed, resulting in improving a through put.

16 Claims, 21 Drawing Sheets

SUBSTRATE PROCESSING APPARATUS AND METHOD

BACKGROUND OF THE INVENTION

1. Field of the Invention

The present invention relates to a substrate processing apparatus and a method in which a plurality of substrates are continuously transported among substrate processing parts and efficiently processed. The substrates are classified in different types of lots so as to be transported to the substrate processing parts in different orders and processed with different control parameters, i.e., control conditions of the substrate processing parts, and the like.

2. Description of the Background Art

As well known, in a substrate processing apparatus used to manufacture a pprecision electronic board such as a liquid crystal display board and a semiconductor substrate (hereinafter simply "substrate"), a substrate held by substrate transport means such as a substrate transport robot is transported in a predetermined order among substrate processing parts disposed in an appropriate arrangement such as a rotary spin coating part (hereinafter "spin coater"), a rotary developing part (hereinafter "spin developer"), an adhesive agent coating unit, a cooling plate, a hot plate and etc., while loaded into and unloaded from these processing parts so that the substrate is processed in a continuous series of treatments. As herein termed, "substrate processing parts" generally refer to a spin coater, a spin developer and etc. When referred to individually, a spin coater, a spin developer and the like are referred to by their respective names.

When the substrate processing apparatus successively processes lots which are to be transported in the same flow (i.e.,, a transportation order to the respective substrate processing parts) but in accordance with different data such as a heating time, the last substrate in a preceding or precedent lot and the first substrate in a subsequent lot are loaded into the substrate processing parts successively without any delay. To successively load these substrates without any delay, while the first substrate in the subsequent lot which is loaded during a transitional period is transported at delayed timing or a tact time of the subsequent lot coincides with a tact time of the precedent lot (Japanese Patent Laid-Open Gazette No. 4-113612). As a result, the substrates are processed successively, whereby the through put is improved. Furthermore, the substrates stored in the same lot are prevented from having different heat histories.

If flows for lots which are to be transported are substantially different from each other (e.g., some flows include heating process and spin coating and some other flows do not), interference between, i.e., confusion of treatments on substrates of a precedent lot and a subsequent lot is created due to contention between these substrates or passing of one substrate. To overcome this problem, in the substrate processing apparatus, processing of the substrates of the subsequent lot is stared after all of the processed substrates of the precedent lot are returned into a cassette. Hence, many substrate processing parts stay idle during a transition between the precedent and the subsequent lots which have different flows from each other. The loss time created at this stage substantially deteriorates the through put. When there is no substrate processing part which processes both the precedent and the subsequent lots, in particular, all substrate processing parts which are necessary to process the subsequent lot cannot be used while the precedent lot is processed, resulting in a decrease in efficiency.

SUMMARY OF THE INVENTION

The present invention is directed to a substrate processing apparatus for processing a precedent and a subsequent lot each of which is formed by a plurality of substrates. The apparatus comprises: a plurality of first processing parts each of which processes the substrates of the precedent lot; a plurality of second processing parts each of which processes the substrates of the subsequent lot; transport means for circulating among the first processing parts while holding the substrates of the precedent lot to perform circulating transportation for the precedent lot, thereby to process the substrates of the precedent lot by first processing and circulating among the second processing parts while holding the substrates of the subsequent lot to perform circulating transportation for the subsequent lot, thereby to process the substrates of the subsequent lot by second processing; and double flow control means for controlling the transport means to perform double flow processing in which circulating transportation for the precedent lot is interrupted after starting of the circulating transportation of the first substrate of the precedent lot before starting of the circulating transportation of the last substrate of the precedent lot and then at least one circulating transportation for the subsequent lot is performed.

In an aspect of the present invention, the apparatus further comprises: flex flow control means for controlling the transport means to perform flex flow processing in which circulating transportation for the subsequent lot is started after starting of the circulating transportation of the substrate of the precedent lot before the completion of the first processing under the condition that interference between the first and second processing is prohibited; and selection means for selecting one flow processing out of the double and flex flow processing, such that the substrates are transported in the selected flow processing.

The present invention is also directed to a method of processing substrates of precedent and subsequent lots. The method comprises the steps of: preparing a plurality of first processing parts each of which processes the substrates of the precedent lot; preparing a plurality of second processing parts each of which processes the substrates of the subsequent lot; transporting the substrates of the precedent lot among the first processing parts while processing the substrates of the precedent lot by the first processing parts, thereby to process by first processing; and transporting the substrates of the subsequent lot among the second processing parts while processing the substrates of the subsequent lot by the second processing parts, wherein the substrates are transported in double flow processing in which circulating transportation for the precedent lot is interrupted after starting of the circulating transportation of the first substrate of the precedent lot before starting of the circulating transportation of the last substrate of the precedent lot and then at least one circulating transportation for the subsequent lot is performed.

In an aspect of the present invention, the method further comprises the step of selecting one flow processing out of the double processing and flex flow processing in which circulating transportation for the subsequent lot is started after starting of the circulating transportation of a substrate of the precedent lot before the completion of the first processing under the condition that interference between the first and second processing is prohibited, and wherein the substrates are transported in selected flow processing.

The present invention is also directed to a method of processing substrates of precedent and subsequent lots. The method comprises the steps of: preparing a plurality of first processing parts each of which processes the substrates of the precedent lot; preparing a plurality of second processing parts each of which processes the substrates of the subsequent lot; transporting the substrates of the precedent lot among the first processing parts while processing the substrates of the precedent lot by the first processing parts; judging whether first cycle time required for processing the substrates of the subsequent lot by the second processing parts is ended; and when it is judged that the first cycle time is ended, interrupting the transportation of the substrates of the precedent lot and then transporting the substrates of the subsequent lot among the second processing parts while processing the substrates of the subsequent lot by the second processing parts.

In an aspect of the present invention, the method further comprises the steps of: judging whether second cycle time required for processing the substrates of the precedent lot by the first processing parts is ended; and when it is judged that the second cycle time is ended, interrupting the transportation of the substrates of the subsequent lot and then transporting the substrates of the precedent lot among the first processing parts while processing the substrates of the precedent lot by the first processing parts.

Accordingly, it is an object of the present invention to offer a substrate processing apparatus and a method in which substrate processing parts are effectively used so that the through put in processing substrates is improved even when a plurality of lots having different flows from each other are successively processed.

These and other objects, features, aspects and advantages of the present invention will become more apparent from the following detailed description of the present invention when taken in conjunction with the accompanying drawings.

DESCRIPTION OF THE PREFERRED EMBODIMENTS

Before describing preferred embodiments of the present invention, an operation of a substrate processing apparatus of the present invention will be described in comparison with that of a conventional transportation apparatus.

Figure 1:
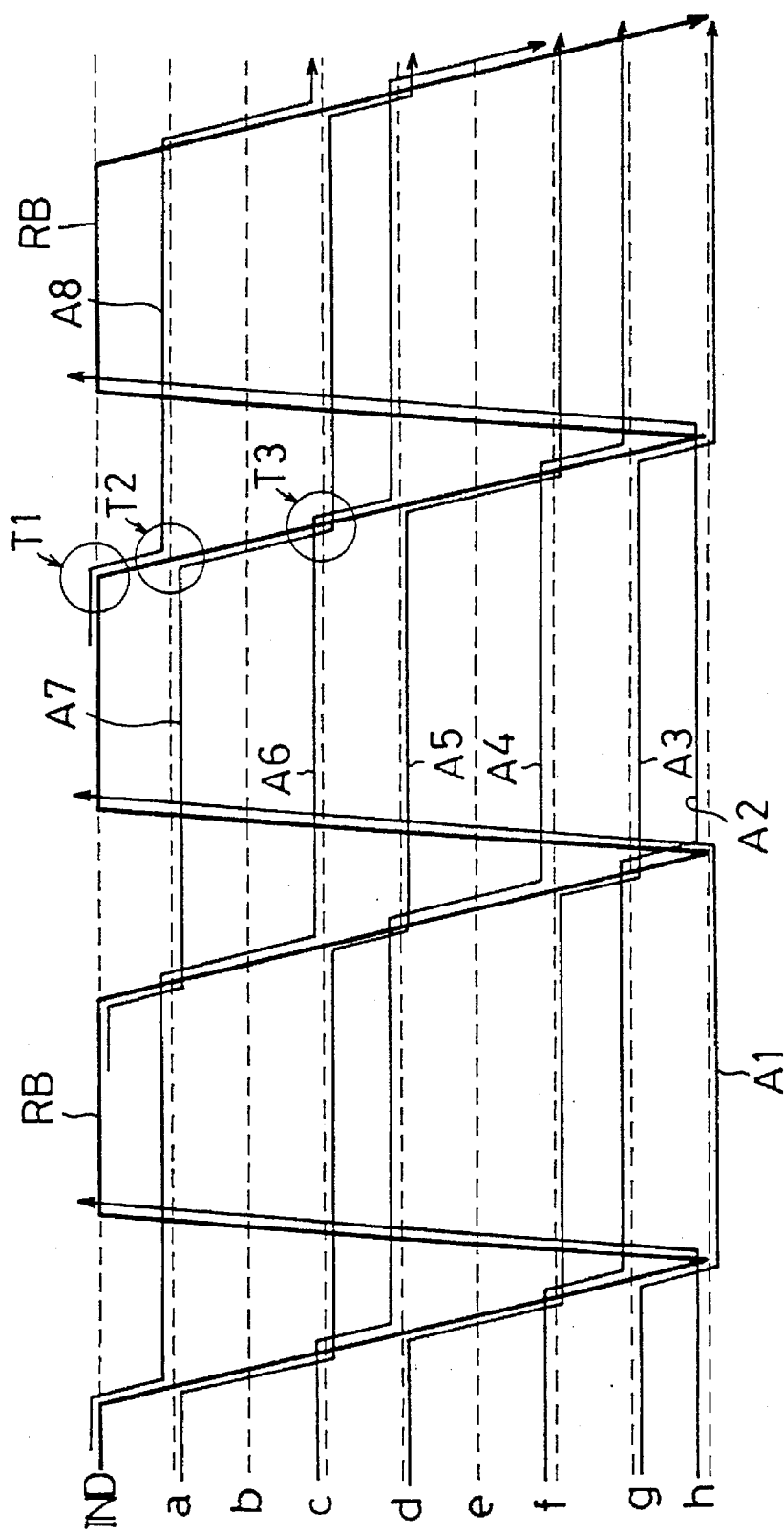
FIGS. 1 to 4 are diagrams for describing the principle of an operation of the present invention by illustrating paths along which the substrates are transported according to the prior art.

FIG. 1 is a diagram showing an operation for transporting a precedent lot. In FIG. 1, the left side, the symbol IND denotes an indexer for retrieving substrates from a cassette and returning the substrates into the cassette, and the other symbols a, b, c, d, e, f, g and h express substrate processing parts such as a heating part, a cooling part, a coating part, a developing part. Time is measured from the left side to the right side. The thick solid line RB denotes movement of a transpart robot which serves as transportation means. The transport robot RB repeatedly and periodically transports a substrate between the respective substrate processing parts (first processing parts) a, c, d, f, g and h and the indexer IND, whereby substrates A1 to A8 are transported from the indexer IND, processed in the substrate processing parts a, c, d, f, g and h in a predetermined flow and returned to the indexer IND. More specifically, at a time $T_1$ for example, the transport robot RB moves to the indexer IND and retrieves a substrate A8 from the cassette. At a time T2, the transport robot RB moves to the substrate processing part a, unloads a substrate A7 from the substrate processing part a and then loads the substrate A8 into the substrate processing part a. Thus, the substrates A7 and A8 are exchanged in the substrate processing part a. Next, at a time $T_3$, the transport robot RB moves to the substrate processing part c and exchanges the substrates A6 and A7. One cycle of circulating transportation completes when the transport robot RB returns to the indexer IND after repeating this set of operations. The substrates A1 to A8 are processed at the substrate processing parts a, c, d, f, g and h in a predetermined flow by repeating the transportation cycle. As mentioned above, the transport robot RB stays waiting at the indexer IND for a predetermined time or longer. This is because the rate of substrate processing at some of the substrate processing parts a, c, d, f, g and h is restricted by a processing time, i.e., the substrate processing parts a to h include rate-limiting parts and therefore the transportation cycle cannot be reduced shorter than the times required for the processing at those rate-limiting parts (For example, if a heating time at a heating unit is the longest among processing times at all substrate processing parts and a time of one cycle of circulating transportation by the transport robot, the heating unit is a rate-restricting processing part.).

Figure 2:
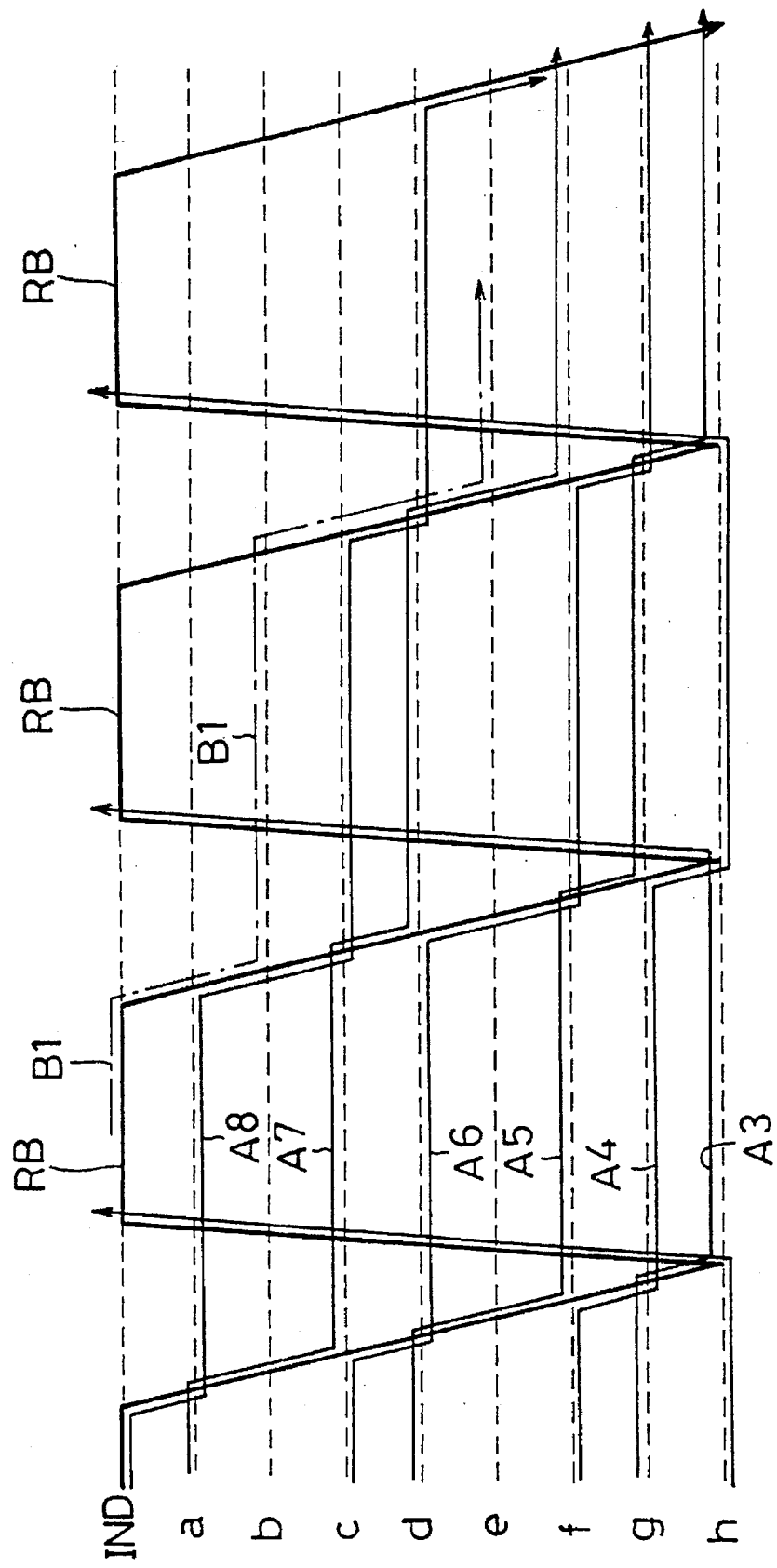
Figure 3:
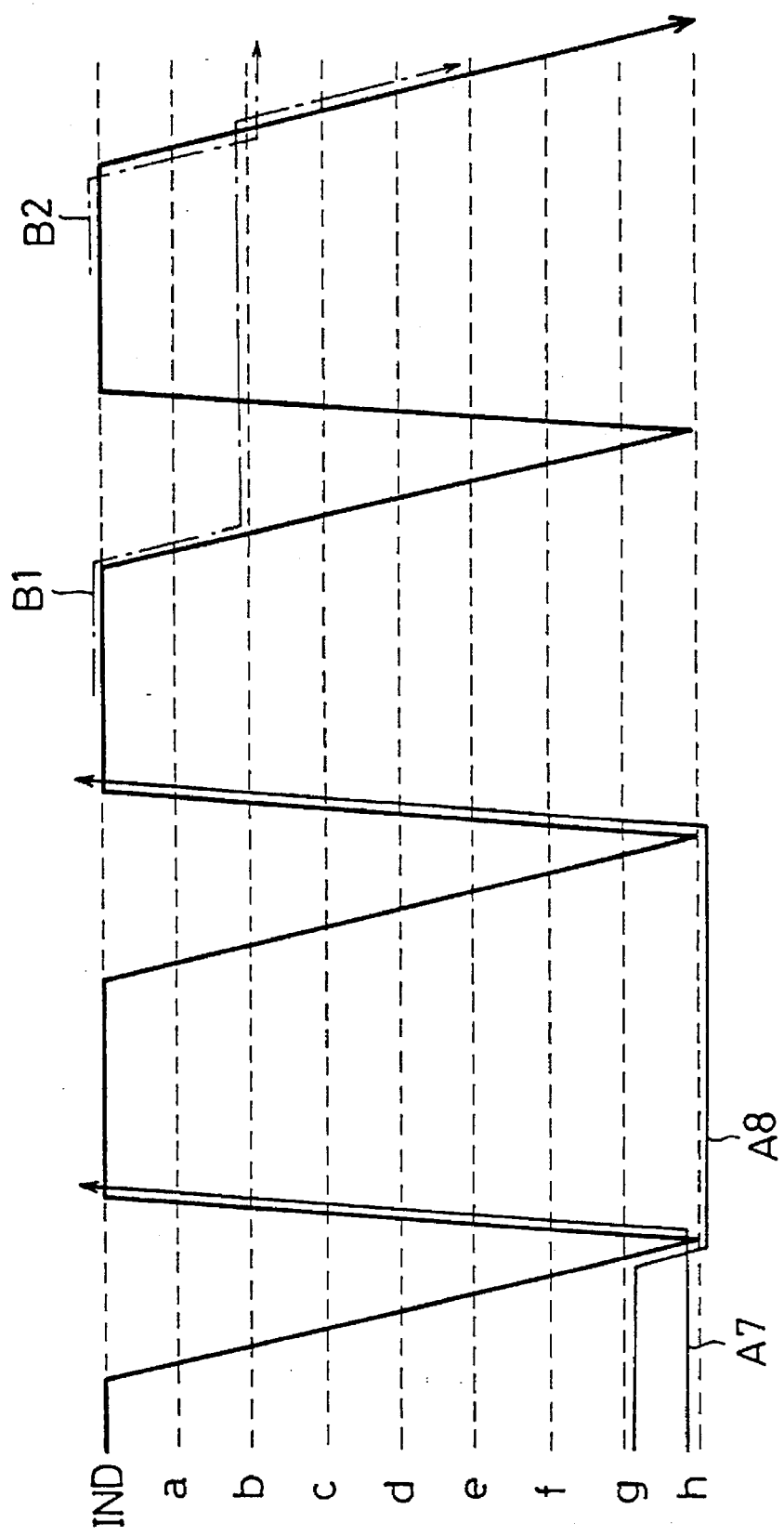

FIGS. 2 and 3 are views for describing a problem which occurs when substrates are circulated as in FIG. 1 by a conventional transportation method. FIG. 2 represents an example wherein the first substrate B1 of a subsequent lot is loaded into the substrate processing part a upon unloading of the last substrate A8 of a precedent lot from the substrate processing part a. In this example, assuming that the substrate processing flow of the subsequent lot uses the substrate processing parts (second processing parts) b and e, the substrates A8 and B1 must be transported at the same time from the substrate processing part a to the substrate processing part b, which are in contention state. To avoid this, in the conventional transportation method, the first substrate B1 of the subsequent lot is not loaded until processing of the last substrate A8 of the precedent lot completes as shown in FIG. 3. In FIG. 3, the first substrate B1 is retrieved from the subsequent lot after processing of the last substrate A8 of the precedent lot finishes and the last substrate A8 is returned to the indexer IND. Although this always prevents contention between the substrates of the precedent and the subsequent lots, substrate processing must wait for as long as six cycles when the treatments for these lots are linked to each other. That is, the substrate processing parts a to f are left idle during this waiting time of six cycles, which deteriorates the through put. In addition, as shown in FIGS. 1 to 3, when there is no substrate processing part which is commonly engaged with by the precedent and the subsequent lots, the substrate processing parts b and e which are necessary to process substrates of the subsequent lot are left unengaged while substrates of the precedent lot are processed. Thus, the substrate processing parts as a whole cannot be used effectively.

Figure 4:
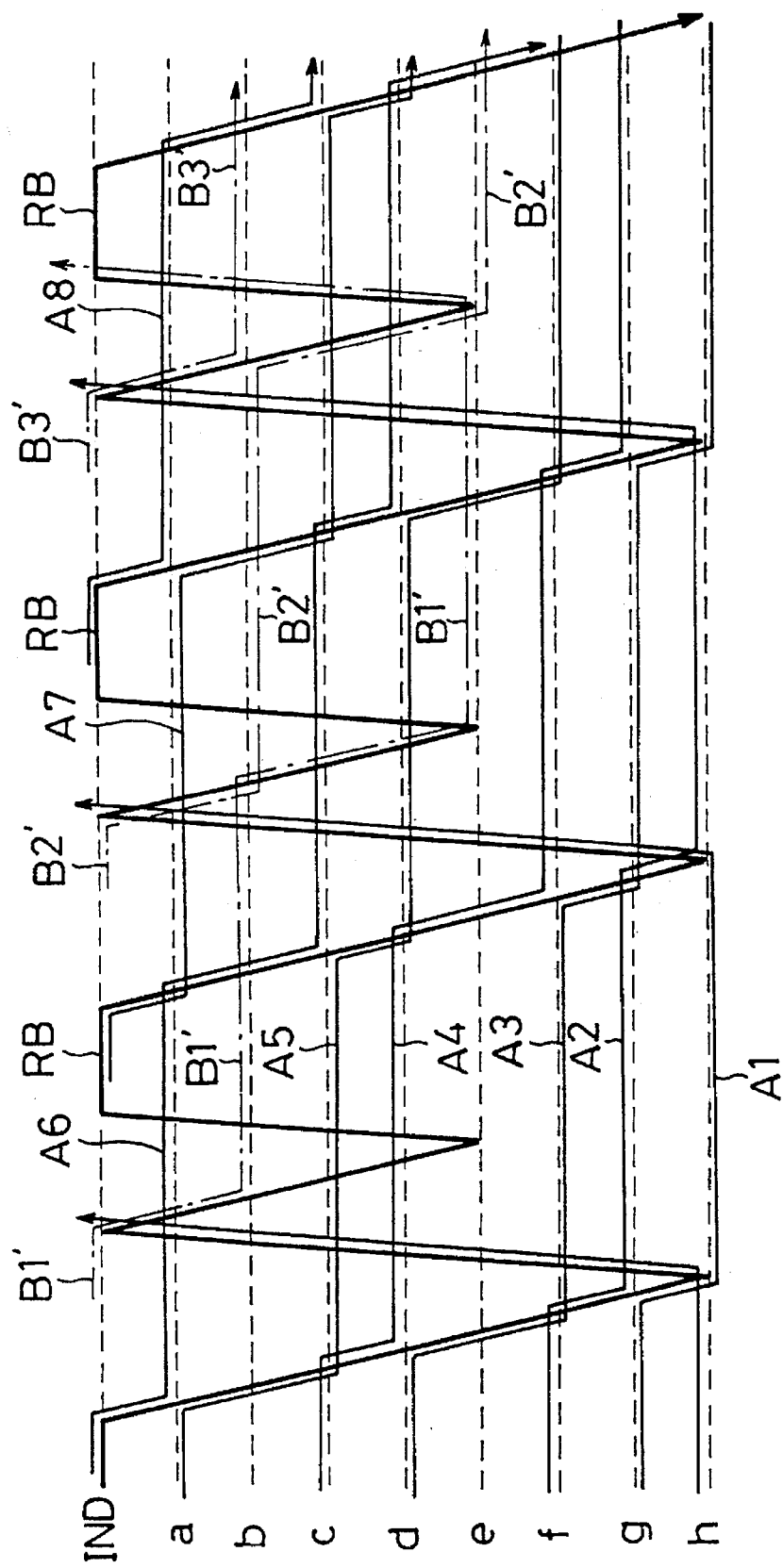

FIG. 4 is a view for describing transportation performed by a substrate processing apparatus of the present invention which solves such a problem as that typically illustrated in FIG. 3. In the substrate processing apparatus of the present invention, the retrieving timing of the substrates B1', B2' and B3' of the subsequent lot is advanced to be concurrently processed with a substrate of the precedent lot. In more detail, circulating transportation of a substrate of the precedent lot is interrupted after starting of circulating transportation of the first substrate A1 of the precedent lot before starting of circulating transportation of the last substrate A8 of the precedent lot and in turn circulating transportation of the substrate B1', B2' and B3' of the subsequent lot are performed. For instance, the transport robot RB which is supposed to stay waiting at the indexer IND moves the substrate processing parts b and e in order while the substrate A6 during its circulating transportation stays within the substrate processing part a, thereby transporting the substrate B1' to the substrate processing part b. The substrates B1', B2' and B3' are processed by repeating this. Thus, it is possible to concurrently process substrates of the subsequent lot during processing of substrates of the precedent lot by interrupting circulating transportation for the precedent lot and then starting circulating transportation for the subsequent lot. The substrate processing parts a to h are used effectively, improving the through put of the substrate processing apparatus. Even when the substrate processing parts do not include a rate-limiting part unlike as described above wherein the premise is that the substrate processing parts a to h include a rate-limiting part, it is possible at least to eliminate a loss time associated with linking of two successive lots which have different flows from each other. Hence, it is possible to improve the through put and concurrently process lots as desired.

Figure 5:
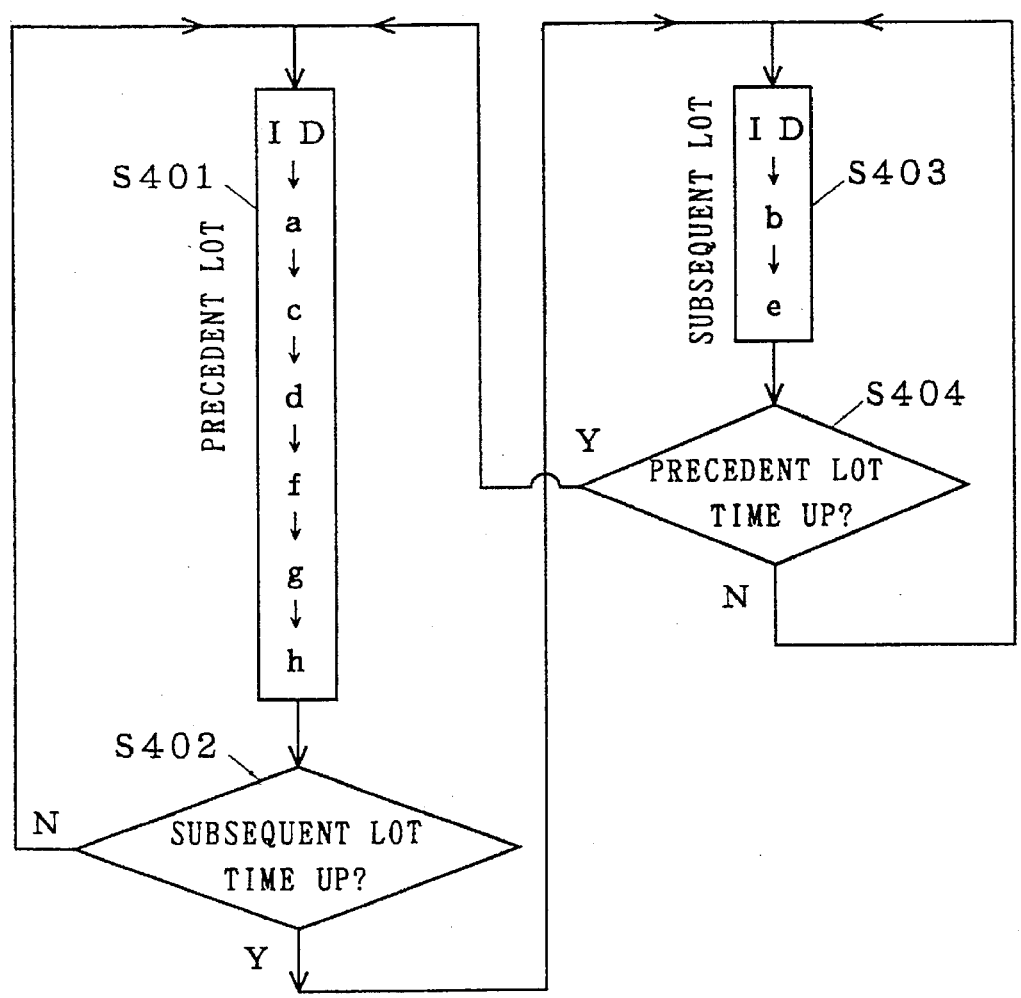
FIG. 5 is a flow chart for explaining the concept of processing in the present invention.

FIG. 5 is a conceptual view of an operation for concurrent transportation of the precedent and the subsequent lots of FIG. 4. At Step S401, a substrate of the precedent lot is transported. Step S402 is then executed to judge whether it is possible to insert transportation of a substrate of the subsequent lot before transportation of the next substrate of the precedent lot, i.e., whether the cycle time of the transportation of the subsequent lot ended (time up). If YES, the sequence proceeds to Step S403 to perform the transportation of the subsequent lot. At Step S404, whether it is possible to insert transportation of a substrate of the precedent lot before transportation of the next substrate of the subsequent lot is judged. If YES, the sequence proceeds to Step S401 to perform the transportation of the precedent lot.

A. Structure of Substrate Processing Apparatus of First Preferred Embodiment

Figure 6:
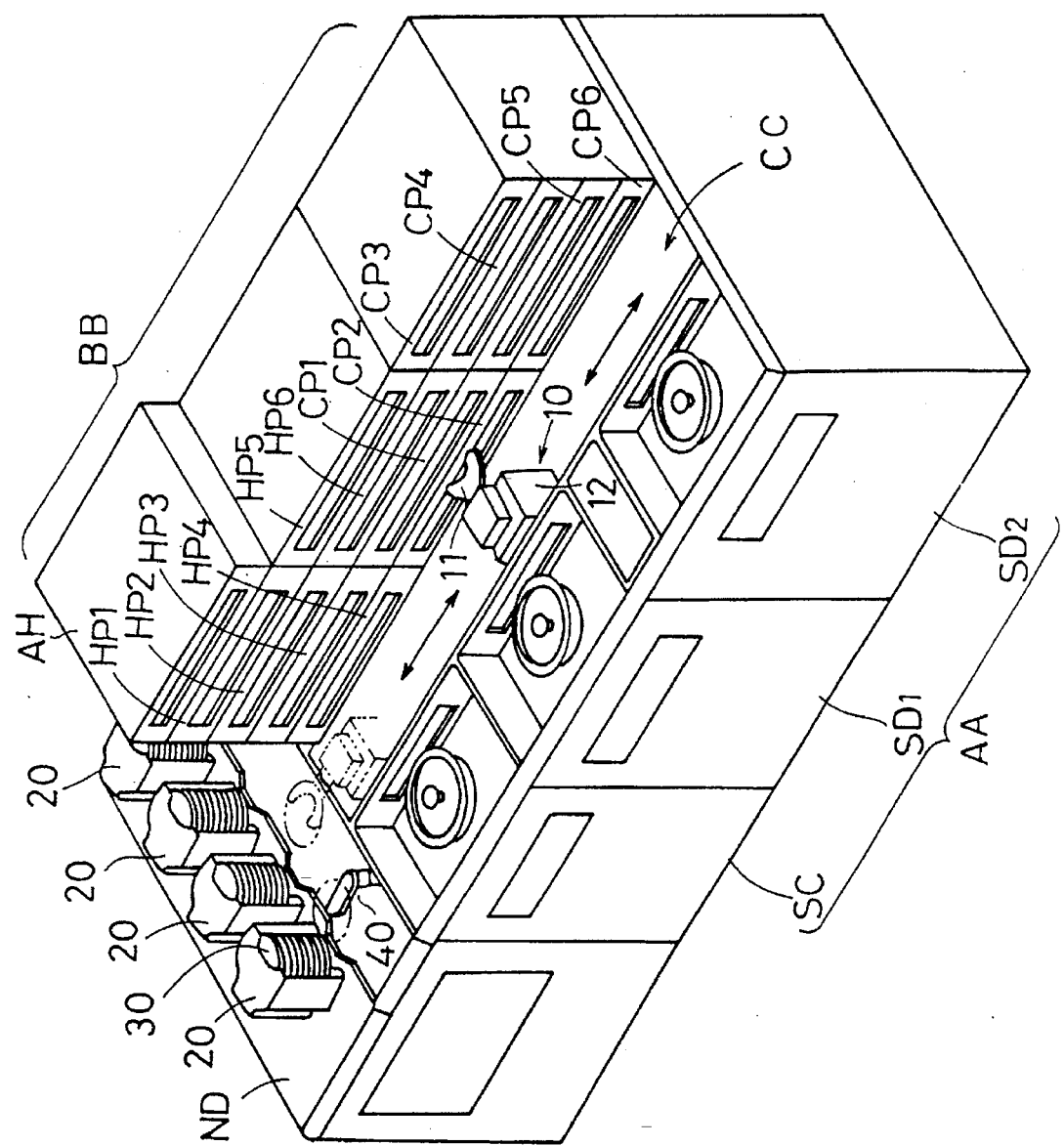
FIG. 6 is a perspective of a substrate processing apparatus according to a first preferred embodiment of the present invention.
Figure 7:
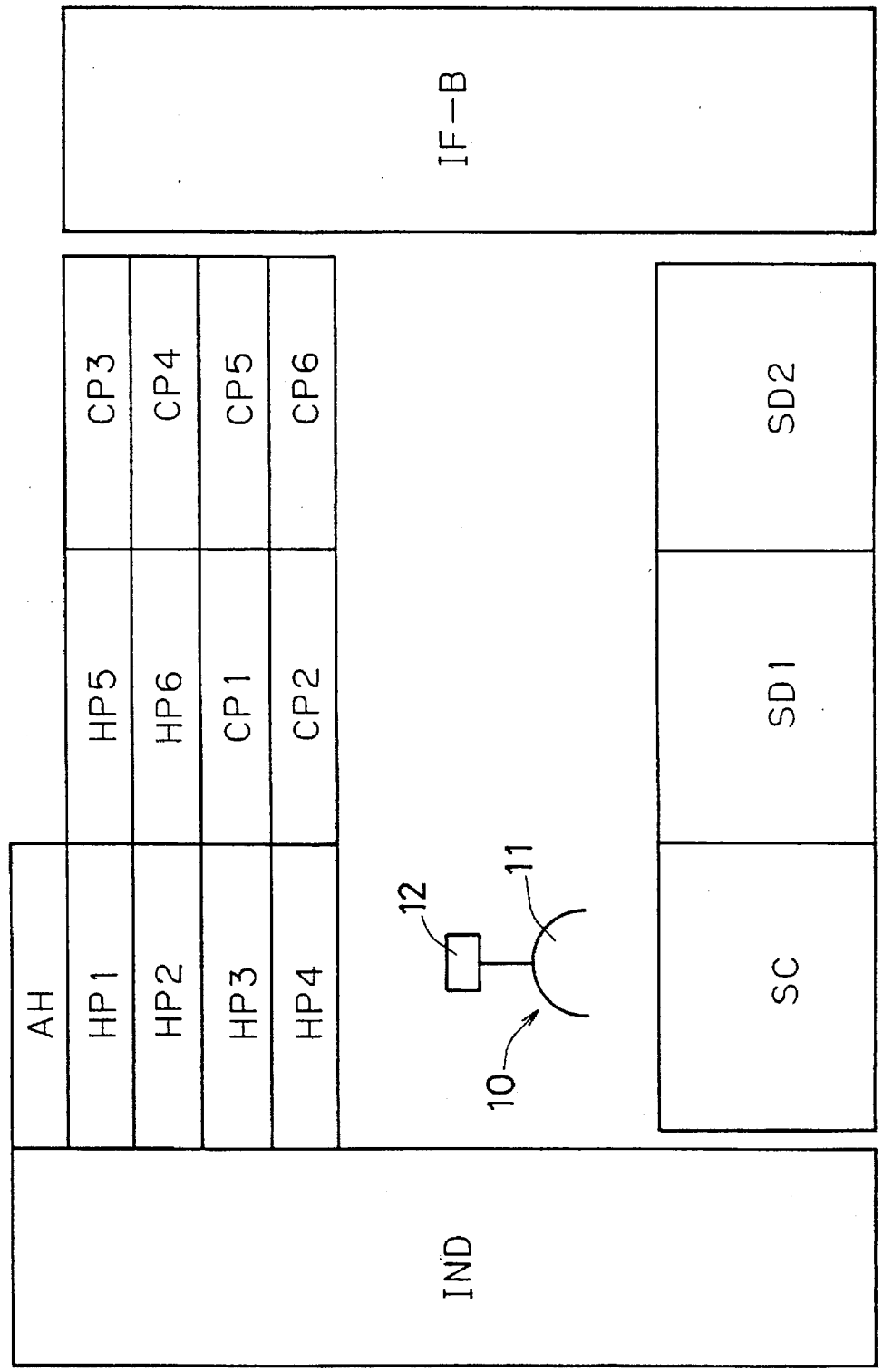
FIG. 7 is a simplified plan view of an arrangement in the substrate processing apparatus of FIG. 6.
Figure 8:
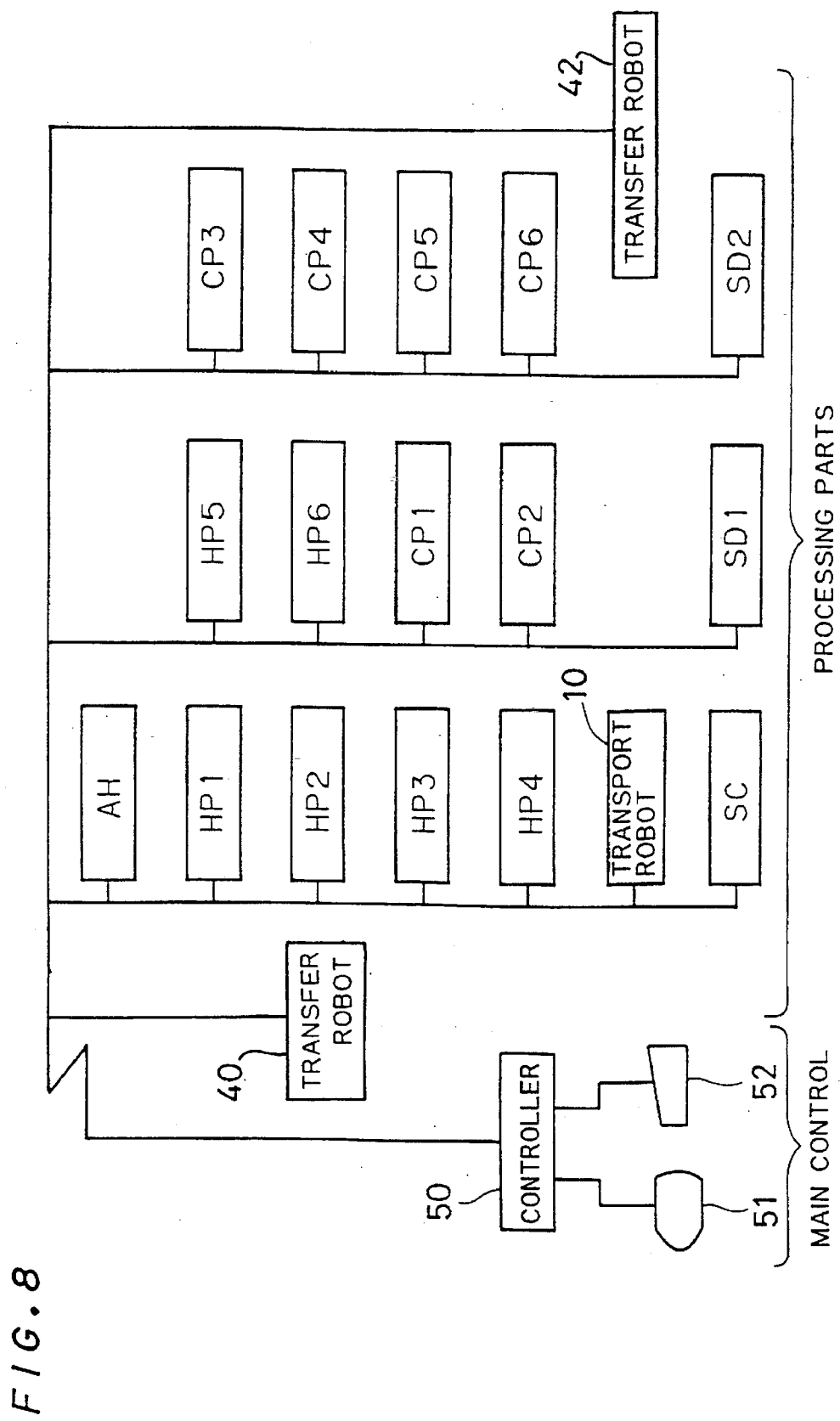
FIG. 8 is a block diagram of the substrate processing apparatus of FIG. 6.

FIG. 6 is a perspective view of a substrate processing apparatus according to a first preferred embodiment of the present invention, FIG. 7 is a schematic diagram of an arrangement of the substrate processing parts which constitute the substrate processing apparatus of FIG. 6 and FIG. 8 is a block diagram of the substrate processing apparatus of FIG. 6.

The substrate processing apparatus illustrated in FIG. 6 is for performing a series of treatments on substrates 30 (The treatments are coating, developing, coating of an adhesive agent, heating and cooling in the first preferred embodiment.). A spin coater SC, or a substrate processing part for coating a substrate, and spin developers SD1 and SD2, or substrate processing parts for developing, are installed on the front side to form a substrate processing row AA.

On the back side facing the substrate processing row AA, an adhesive agent coating unit AH for performing various types of heating, hot plates HP1 to HP6 and cooling plates CP1 to CP6 are disposed in a three-dimensional arrangement to form a substrate processing zone BB.

The substrate processing apparatus further includes a transportation zone CC which extends along the substrate processing row AA between the substrate processing row AA and the substrate processing zone BB. A transport robot 10 is disposed freely movable in the transportation zone CC. The transport robot 10 comprises a movable element L12 which includes a holding member K11. The holding member 11 consists of a pair of arms which supports the substrates 30. The upper and lower arms of the arm pair which constitute the holding member 11, when driven by an arm mechanism (not shown), independently move toward and retract from the substrate processing row AA side and the substrate processing zone BB side, respectively. One arm receives a processed substrate from a particular one of the processing parts of the substrate processing row AA and the substrate processing zone BB, while the other arm loads other substrate unloaded from a previous substrate processing part or the like into this particular substrate processing part, whereby the substrates 30 are exchanged at this particular processing part above.

Although not shown in FIG. 6, a three-dimensional drive mechanism is linked to the movable element 12 of the transport robot 10. The movable element 12 is moved to the respective substrate processing parts by controlling the drive mechanism, and the substrates 30 are loaded and unloaded.

The indexer IND is installed on one end side' where the substrate processing row AA, the substrate processing zone BB and the transportation zone CC terminate (i.e., left-hand side in FIG. 6), to retrieve unprocessed substrates 30 from a cassette 20 and return processed substrates 30 to the cassette 20. A transfer robot 40 disposed to the indexer IND retrieves the substrates 30 from the cassette 20 and transports the substrates 30 to the transport robot 10, or conversely receives the already processed substrates 30 from the transport robot 10 and returns the substrates 30 back into the cassette 20. Although not shown in FIG. 6, an interface buffer IF-B (FIG. 7) is disposed where the substrate processing row AA, the substrate processing zone BB and the transportation zone CC terminate at the opposite end (i.e., right-hand side in FIG. 6), to unload and load the substrates 30 from and into other substrate processing apparatus. Loading and unloading of the substrates 30 is realized by a concerted operation of a transfer robot 42 of the interface buffer IF-B and the transport robot 10.

In FIG. 8, a controller 50 is a computation processing device including a computation part and a memory. The controller 50 is connected to a display 51 and a keyboard 52 and communicable with the respective substrate processing parts and the transport robot 10. In accordance with data entered via the keyboard 52, the controller 50 performs various operations including computation as described later to control operations of the transport robot 10, the spin coater SC, the hot plates HP1 to HP6 and etc.

B. Operation of Substrate Processing Apparatus of First Preferred Embodiment

Figure 9:
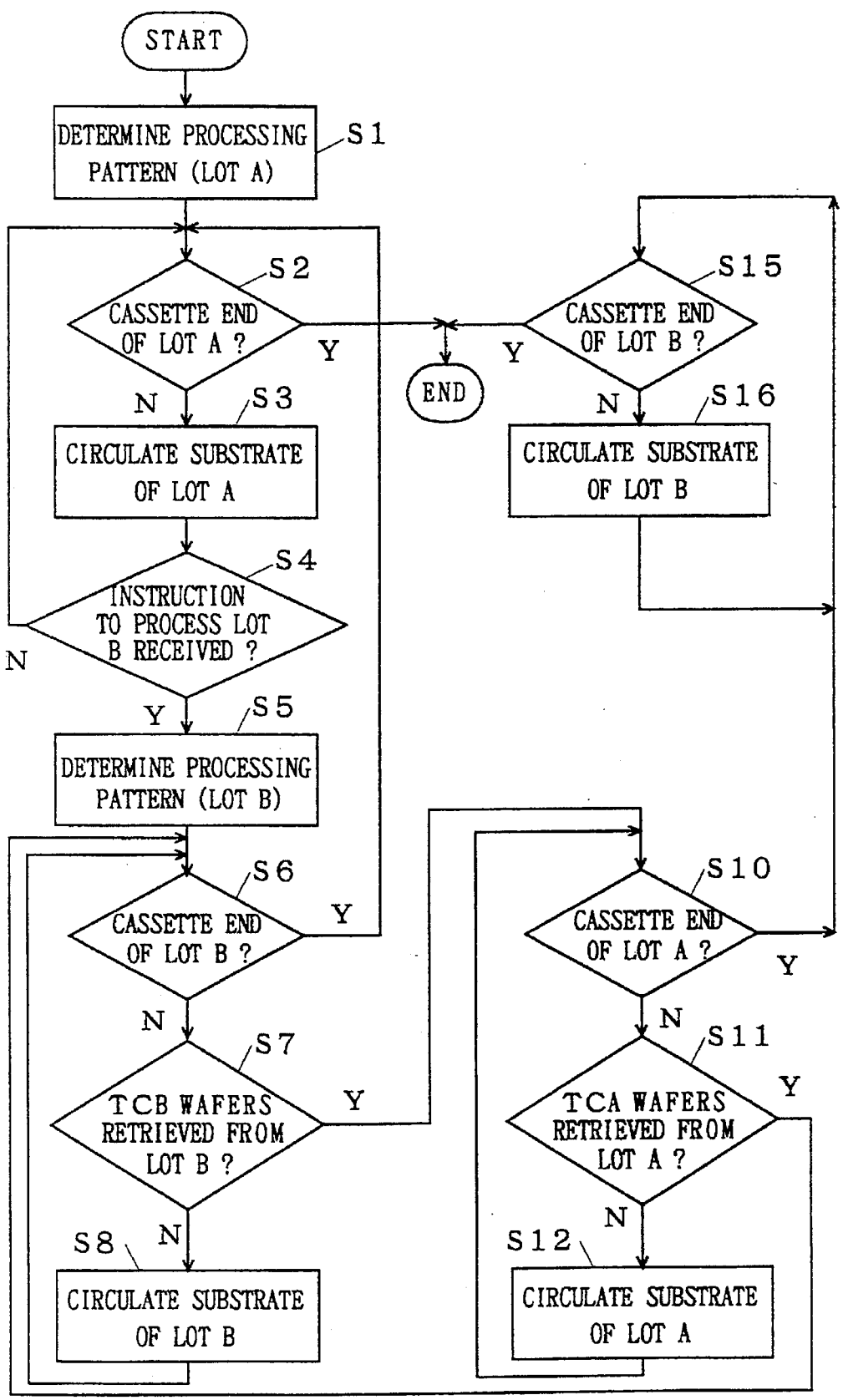
FIG. 9 is a flow chart of an operation of a substrate processing apparatus according to the first preferred embodiment.

FIG. 9 is a flow chart of an operation of the substrate processing apparatus according to the first preferred embodiment. The substrate processing apparatus of the first preferred embodiment concurrently processes substrates of a precedent and a subsequent lots when an instruction to perform processing on the subsequent lot B is received during processing on the precedent lot A which has a different flow from that of the subsequent lot B. In the following, an operation of the substrate processing apparatus, and particularly procedures of transporting the substrates 30 will be described with reference to the flow chart in FIG. 9.

As herein termed, "different flow" refers to processing in which a transportation order of one substrate 30, that is, processing procedures (hereinafter "wafer flow") of that substrate 30 is different from that of other substrates. For example, the wafer flow is different when the substrate processing parts used to process the substrate 30 of a first cassette as a precedent lot are partly or entirely different from those to process the substrate 30 of a second cassette as a subsequent lot or when the order of using the substrate processing parts is different between the first and the second cassettes.

Flows are different between the precedent and subsequent lots A and B in two situations, one in which there is no substrate processing part which is commonly engaged with during wafer flows of the lots A and B, and the other in which there is such a commonly engaged substrate processing part. When there is no commonly engaged substrate processing part, all substrate processing parts which are necessary to process a substrate of the subsequent lot B are vacant during processing of a substrate of the precedent lot A. Hence, a substrate of the subsequent lot B is transported during processing of a substrate of the precedent lot A to concurrently process substrates of the lots A and B and hence to effectively utilize these substrate processing parts which are left unengaged. For convenience of description, such a processing method will be referred to as "double flow." In contrast, when there is a commonly engaged substrate processing part, none of the substrate processing parts which are necessary to process a substrate of the subsequent lot B is vacant during processing of a substrate of the precedent lot A. Hence, "double flow" processing is impossible. Due to this restraint, the retrieving timing of a substrate of the subsequent lot B is advanced under a condition that interference of processing is prohibited when processing of a substrate of the precedent lot A and a substrate of the subsequent lot B are linked to each other. As a result, a time loss in successive processing of the precedent and the subsequent lots A and B is reduced. For convenience of description, such a processing method will be referred to as "flex flow."

Either one of the "double flow" processing method and the "flex flow" processing method should be adopted depending on whether there is a commonly engaged substrate processing part. However, since the present invention relates to a substrate processing apparatus for performing the "double flow" processing method, the description below on the first preferred embodiment will adhere to "double flow" processing where processing of a substrate of the subsequent lot B is inserted in processing of a substrate of the precedent lot A which has a completely different flow from that of the subsequent lot B.

First, a pattern regarding the precedent lot A is determined as shown in FIG. 9 (Step S1).

More specifically, an operator enters the number of the cassettes 20 as the precedent lot A, the number of the substrates 30 contained in the cassettes 20, a wafer flow of the precedent lot A, processing conditions and etc at Step S1. If necessary, the operator inputs information regarding the arrangement of the substrate processing parts in the apparatus and information regarding the transport robot 10 on the keyboard 52. Although a wafer flow is an order of transporting the substrates 30 (transportation order) in principle as described above, other factors such as a processing time at each substrate processing part (processing time) are also included in the wafer flow. Processing conditions include a processing temperature, a rotation speed, the type of a processing liquid and etc.

Next, in accordance with the wafer flow of the precedent lot A, the processing condition and other information, parameters are calculated which are needed to successively process the substrates 30 which are contained the cassettes 20 of the precedent lot A. For instance, the parameters determined here in accordance with the transportation orders of the substrates 30, the processing time and the like are a detailed operation routine of the transport robot 10, a detailed processing pattern at each substrate processing part (or unit) and a transportation cycle (cycle time) of circulating transportation of the substrates 30.

Following this, whether the current circulating transportation is the last circulation of the last substrate 30 of the precedent lot A is judged (Step S2). If YES, the processing on the precedent lot A completes.

If NO, the transport robot 10 which was waiting in front of the indexer IND performs one cycle of circulating transportation (step S3) among the substrate processing parts in accordance with the processing conditions and the other parameters entered and determined at Step S1, to thereby advance the processing of the substrates 30 of the precedent lot A by one flow step. As a result, the first substrate 30 is retrieved from the cassette 20 (the precedent lot A) to be ready for loading within the indexer IND. Step S4 is then executed to judge whether the operator has already given an instruction to process a substrate of the next lot B. If NO, the sequence returns to Step S2. Steps S2 to S4 are repeated if the current circulating transportation is not the last circulation of the last substrate 30 of the precedent lot A, thereby serially processing the substrates 30 of the precedent lot A. Each substrate 30 of the precedent lot A is processed in accordance with the predetermined wafer flow in this manner.

If the instruction to process a substrate of the next lot B is confirmed at Step S4, a pattern and the like for the subsequent lot B are determined (Step S5). That is, parameters are calculated which are needed to successively process the substrates 30 contained in the cassettes 20 as the subsequent lot B based on the wafer flow, the processing condition and the like regarding the subsequent lot B. For instance, the parameters determined here in accordance with the transportation orders of the substrates 30, the processing time and the like are a detailed operation routine of the transport robot 10, a detailed processing pattern at each substrate processing part (or unit) and etc.

Other parameters are also determined here which are necessary to interrupt the circulating transportation for the precedent lot A and then start circulating transportation for the subsequent lot B, to thereby concurrently process substrates of the precedent and the subsequent lots A and B. First, a cycle time $T_A$ for the precedent A and a cycle time $T_B$ for the subsequent lot B are determined. The cycle times $T_A$ and $T_B$ are maximum values of:

$$T_{An}=(A \text{ processing time})+(A \text{ processing preparation time})+(A \text{ transfer time})$$

$$T_{Bn}=(B \text{ processing time})+(B \text{ processing preparation time})+(B \text{ transfer time})$$

In short, the cycle times $T_A$ and $T_B$ are maximum values of values $T_{An}$ and $T_{Bn}$ which are associated with a rate-limiting part. A processing time refers to a time required for processing of one substrate of the lot A by various treatments at the respective substrate processing parts (or units). A processing preparation time refers to a time required for set-up for processing of the substrates of the lot A at the respective substrate processing parts (or units). A transfer time refers to a time required to exchange the substrates 30 of the lot A at the respective substrate processing parts (or units). B processing time refers to a time required for processing of one substrate of the lot B by various treatments at the respective substrate processing pans (or units). B processing preparation time refers to a time required for set-up for processing of the substrates of the lot B at the respective substrate processing parts (or units). B transfer time refers to a time required to exchange the substrates 30 of the lot B at the respective substrate processing parts (or units).

Table 1 below shows a pair of different flows to describe a specific method of calculating the cycle times $T_A$ and $T_B$.

TABLE 1

| Lot A | | Lot B |
|---|---|---|
| IND (L) | | IND (L) |
| AH | (50 sec) | |
| CP1 | (50 sec) | |
| SC | (50 sec) | |
| HP1    HP2 | (80 sec) | |
| CP1    CP3 | (80 sec) | |
| IF-B | | |

TABLE 1-continued

| Lot A | | Lot B |
|---|---|---|
| HP3 | (50 sec) | |
| CP4 | (50 sec) | |
| SD1    SD2 | (110 sec) | |
| HP4    HP5 | (120 sec) | |
| CP5 | (50 sec) | |
| | | HP6 (300 sec) |
| | | CP6 (50 sec) |
| IND (UL) | | IND (UL) |

In Table 1, the symbol IND(L) indicates retrieving of a substrate from the indexer, the symbol AH indicates coating of an adhesive agent, the symbols HP1 to HP6 indicate treatments by the hot plates, the symbols CP1 to CP6 indicate treatments by the cooling plates, the symbol SC indicates a treatment by the spin coater, and the symbol IND(UL) indicates returning of a substrate into the indexer. The figures in the parentheses express net times of the respective treatments.

The lots A and B both include rate-limiting parts, and therefore, the cycle times $T_A$ and $T_B$ are:

$$T_A=(120+6+2.5)/2=64.24 \text{ sec}$$

$$T_B=(300+6+2.5)=308.5 \text{ sec}$$

For the cycle time $T_A$, the parenthesized figure is divided by 2 considering that the rate-limiting treatments HP4 and HP5 are concurrent processing. Of each parenthesized figure, 6 sec is a processing preparation time while 2.5 sec is a transfer time. Concurrent processing aims at preventing deterioration in the through put due to a rate-limiting factor such as it long heating time during the wafer flow. In concurrent processing, a plurality of the substrates 30 are processed concurrently at a plurality of the same substrate processing parts (or units) while shifting the timing of the treatment, thereby eliminating a waiting time, or a time loss at other processing parts and improving the overall through put.

Next, a transportation-time $TR_A$ of the precedent lot A and a transportation time $TR_B$ of the subsequent lot B are determined. The transportation times $TR_A$ and $TR_B$ are maximum values of:

$$TR_A=(A \text{ flow step number})\times(1 \text{ step transportation time})$$

$$TR_B=(B \text{ flow step number})\times(1 \text{ step transportation time})$$

A flow step number is 1 addeed to the number of the substrate processing parts (or units) which are engaged with during a wafer flow of the precedent lot A (The value 1 added here is the indexer IND.). B flow step number is 1 addeed to the number of the substrate processing parts (or units) which are engaged with during the wafer flow of the subsequent lot B (The value 1 added here is the indexer IND.). Further, 1 step transportation time is a time in which the transport robot 10 moves around among the substrate processing parts (or units). 1 step transportation time includes a time necessary to exchange the substrates 30 at the substrate processing parts (or units).

The transportation times $TR_A$ and $TR_B$ with respect to the wafer flows of Table 1 are calculated as:

$$TR_A=12\times(2.5+2.5)=60 \; sec$$

$$TR_B=3\times(2.5+2.5)=15 \; sec$$

It is assumed here that a travelling time of the transport robot 10 and a time necessary to exchange the substrates 30 are both 2.5 sec.

Next, a transportation wait time WA of the precedent lot A and a transportation wait time $W_B$ of the subsequent lot B are calculated. The transportation wait times $W_A$ and $W_B$ are:

$$W_A=T_A-TR_A$$

$$W_B=T_B-TR_B$$

If any one of the transportation wait times $W_A$ and $W_B$ calculated as above has a negative value, the negative transportation wait time is determined as 0. That is, the transportation wait times $W_A$ and $W_B$ are determined as 0 if the rates of the wafer flows are to be restricted by a processing time, which allows the transport robot 10 to continue transportation without suspended at all. More precisely, the transportation wait times $W_A$ and $W_B$ with respect to the wafer flows of Table 1 are calculated as:

$$W_A=64.25-60=4.25 \; sec$$

$$W_B=308.5-15=293.5 \; sec$$

Thus, the rates of the wafer flows are to be restricted by a processing time rather than by a transportation time.

Next, a successive processing cycle number $TC_A$ of the precedent lot A and a successive processing cycle number $TC_B$ of the subsequent lot B are calculated. The successive processing cycle numbers $TC_A$ and $TC_B$ are calculated as:

$$TC_A=INT\;(W_B \div T_A)+1$$

$$TC_B=INT\;(W_A \div T_B)+1$$

The successive processing cycle number $TC_A$ expresses how many processing cycles are possible on the precedent lot A from immediately after the end of the first circulation of a substrate of the subsequent lot B until immediately before the next circulation of the substrate of the subsequent lot B is allowed. The successive processing cycle number $TC_B$ expresses how many processing cycles are possible on the precedent lot B from immediately after the end of the first circulation of a substrate of the precedent lot A until immediately before the next circulation of the substrate of the subsequent lot A is allowed. The reason for adding a value 1 during calculation of the successive processing cycle numbers $TC_A$ and $TC_B$ is to ensure that even in the case of processing-time restricted or transportation-time restricted wafer flows in which processing of one of two successive lots completes while the other is still in a waiting state after transported, the early completing lot is transported at least once. This permits the two successive lots A and B to be alternately transported even in the worst case.

More precisely, with respect to the wafer flows of Table 1, the successive processing cycle numbers $TC_A$ and $TC_B$ are calculated as:

$$TC_A=4+1=5$$

$$TC_B=0+1=1$$

After calculating the necessary values at Step S5 in the manner as described above, Step S6 is executed to judge whether the current circulating transportation is the last circulation of the last substrate 30 of the subsequent lot B. If YES, deciding that the processing of the subsequent lot B is complete, the sequence returns to Step S2. This is repeated until the last circulation of the last substrate 30 of the precedent lot A is detected, thereby serially processing the remaining substrates 30 of the precedent lot A (Steps S2 to S4).

If it is judged at Step S6 that the current circulating transportation is not the last circulation of the last substrate 30 of the subsequent lot B, Step S7 is executed to judge whether the substrates 30 of the subsequent lot B were circulated for the successive processing cycle number $TC_B$. If NO, in accordance with the processing conditions and the other parameters entered and determined at Step S5, the transport robot 10 which was waiting in front of the indexer IND performs one cycle of circulating transportation among the substrate processing parts, whereby the processing of the substrates 30 of the subsequent lot B is advanced one cycle (Step S8). After Step S8, the sequence returns to Step S6 to judge whether the current circulating transportation is the last circulation of the last substrate 30 of the subsequent lot B. If NO, the substrates 30 of the subsequent lot B are serially processed (Steps S6 to S8).

If it is judged at Step S7 that the successive processing cycle number $TC_B$ was reached, deciding that the interrupting for the subsequent lot B is complete, Step S10 is executed to judge whether the current circulating transportation is the last circulation of the last substrate 30 of the precedent lot A. If NO, Step S11 is executed to judge whether the substrates 30 of the precedent lot A were circulated for the successive processing cycle number $TC_A$. If NO, in accordance with the processing conditions and the other parameters entered and determined at Step S1, the transport robot 10 performs one cycle of circulating transportation among the substrate processing parts, whereby the processing of the substrates 30 of the precedent lot A is advanced one cycle (Step S12). After Step S12, the sequence returns to Step S10 to judge whether the current circulating transportation is the last circulation of the last substrate 30 of the precedent lot A. If NO, the substrates 30 of the precedent lot A are serially processed (Steps S10 to S12).

If it is judged at Step S11 that the successive processing cycle number $TC_A$ was reached, deciding that the interrupting for the precedent lot A is complete, the sequence returns to Step S6 to judge whether the current circulating transportation is the last circulation of the last substrate 30 of the subsequent lot B. If NO, the substrates 30 of the subsequent lot B are serially processed until it is judged at Step S7 that the successive processing cycle number $TC_B$ was reached (Steps S6 to S8).

If it is judged at Step S7 that the successive processing cycle number $TC_B$ was reached, the sequence returns to Step S10 to judge whether the current circulating transportation is the last circulation of the last substrate 30 of the precedent lot A. If NO, the substrates 30 of the precedent lot A are serially processed until it is judged at Step S11 that the successive processing cycle number $TC_A$ was reached (Steps S10 to S12).

As described above, the substrates of the precedent and the subsequent lots A and B are concurrently processed by repeating the loop (Steps S6 to S8) for circulating the substrates 30 of the subsequent lot B for $TC_B$ times and the loop (Steps S10 to S12) for circulating the substrates 30 of the precedent lot A for $TC_A$ times.

If it is judged at Step S10 that the current circulating transportation is the last circulation of the last substrate 30 of the precedent lot A, deciding that the processing of the precedent lot A is complete, the sequence proceeds to Step S15. The remaining substrates 30 of the subsequent lot B are serially processed until the last circulation of the last substrate 30 of the subsequent lot B is detected (Steps S15 and S16).

In the following, a specific example of an operation of the substrate processing apparatus according to the first preferred embodiment will be described. Table 2 below shows wafer processing cycles in the apparatus of the first preferred embodiment where the apparatus successively processes substrates of the precedent and the subsequent lots A and B of Table 1 having different flows from each other. Table 2 shows whether the substrates 30 are present in the substrate processing parts (or units) after one unprocessed substrate 30 retrieved from a wafer transfer position of the indexer IND and circulated by the transport robot 10 returns to the indexer IND.

In Table 2, the letter A expresses that the substrate 30 of the precedent lot A is present, the letter B expresses that the substrate 30 of the subsequent lot B is present, and the letter X expresses that the substrate 30 is not present. Hyphen expresses that there is no change.

As clearly seen in Table 2, processing of the substrates of the lot A performed for 5 cycles is always followed by the processing of the substrates of the lot B performed for 1 cycle which has a different flow from that of the lot A. Since no particular operation is performed to maintain the cycle time constant, during the first processing cycle No. 3 for the lot B, the transportation time is 10 sec while the transport robot 10 moves and exchanges substrates twice. During the processing cycles No. 9 and No. 15, the transportation time is 15 sec while the transport robot 10 moves and exchanges substrates three times. Thus, it is possible to perform 5 treatments on the substrate 30 of the precedent lot A during the cycle time for circulating the substrate 30 of the subsequent lot B. Hence, a time loss is eliminated which is created in the conventional apparatus which requires retrieving of substrates from the subsequent lot B to wait.

Table 3 below shows wafer processing cycles of the conventional apparatus during successive processing of substrates of the lots A and B of Table 1 having different flows from each other. The symbol [A] denotes the last substrate 30 of the lot A.

TABLE 2

| Lot A | (1) | (2) | (3) | (4) | (5) (6) | (7) (8) | (9) | (10) | (11) | (12) | (13) | (14) | (15) | (16) | (17) | | | |
|---|---|---|---|---|---|---|---|---|---|---|---|---|---|---|---|---|---|---|
| Lot B | ID (1) | AH | C1 | SC | H1 H2 | C2 C3 | IF | H3 | C4 | D1 | D2 | H4 | H5 | C5 | H6 (2) | C6 (3) | ID (4) | |
| Processing Cycle | | | | | | | | | | | | | | | | | | |
| 1 | A | A | A | A | A A | A A | A | A | A | A | A | A | A | A | X | X | A | Cycle time 64.25 sec |
| 2 | B | A | A | A | A A | A A | A | A | A | A | A | A | A | A | X | X | A | |
| 3 | A | — | — | — | — — | — — | — | — | — | — | — | — | — | — | B | X | X | Transportation time 10 sec |
| 4 | A | A | A | A | A A | A A | A | A | A | A | A | A | A | A | — | X | A | ⎤ |
| 5 | A | A | A | A | A A | A A | A | A | A | A | A | A | A | A | — | X | A | \| |
| 6 | A | A | A | A | A A | A A | A | A | A | A | A | A | A | A | — | X | A | \| 64.25 × 5 |
| 7 | A | A | A | A | A A | A A | A | A | A | A | A | A | A | A | — | X | A | \| = 321.25 |
| 8 | B | A | A | A | A A | A A | A | A | A | A | A | A | A | A | — | X | A | ⎦ |
| 9 | A | — | — | — | — — | — — | — | — | — | — | — | — | — | — | B | B | X | Transportation time 15 sec |
| 10 | A | A | A | A | A A | A A | A | A | A | A | A | A | A | A | — | X | A | ⎤ |
| 11 | A | A | A | A | A A | A A | A | A | A | A | A | A | A | A | — | X | A | \| |
| 12 | A | A | A | A | A A | A A | A | A | A | A | A | A | A | A | — | X | A | \| 64.25 × 5 |
| 13 | A | A | A | A | A A | A A | A | A | A | A | A | A | A | A | — | X | A | \| = 321.25 |
| 14 | B | A | A | A | A A | A A | A | A | A | A | A | A | A | A | — | X | A | ⎦ |
| 15 | A | — | — | — | — — | — — | — | — | — | — | — | — | — | — | B | B | B | Transportation time 15 sec |

TABLE 3

| Lot A | (1) | (2) | (3) | (4) | (5) | (6) | (7) | (8) | (9) | (10) | (11) | (12) | (13) | (14) | (15) | (16) | (17) | | |
|---|---|---|---|---|---|---|---|---|---|---|---|---|---|---|---|---|---|---|---|
|  | ID | AH | C1 | SC | H1 | H2 | C2 | C3 | IF | H3 | C4 | D1 | D2 | H4 | H5 | C5 | H6 | C6 | ID |
| Lot B | (1) |  |  |  |  |  |  |  |  |  |  |  |  |  |  |  | (2) | (3) | (4) |

Processing Cycle

| # | | | | | | | | | | | | | | | | | | | | |
|---|---|---|---|---|---|---|---|---|---|---|---|---|---|---|---|---|---|---|---|---|
| 1  | X | X | [A] | A | A | — | A | — | A | A | A | — | A | — | A | A | X | X | A | ⎤ |
| 9  | X | X | X | X | X | X | X | X | X | X | [A] | — | A | — | A | A | X | X | A | ⎮ |
| 10 | X | X | X | X | X | X | X | X | X | X | X | [A] | — | A | — | A | X | X | A | ⎮ Cycle |
| 11 | X | X | X | X | X | X | X | X | X | X | X | — | X | — | A | A | X | X | A | ⎮ time |
| 12 | X | X | X | X | X | X | X | X | X | X | X | X | [A] | — | A | A | X | X | A | ⎮ 64.25 sec |
| 13 | X | X | X | X | X | X | X | X | X | X | X | — | X | A | A | A | X | X | A | ⎮ |
| 14 | X | X | X | X | X | X | X | X | X | X | X | X | X | [A] | X | X | A | ⎮ |
| 15 | X | X | X | X | X | X | X | X | X | X | X | X | X | X | X | X | [A] | ⎦ |
| 16 | B | X | X | X | X | X | X | X | X | X | X | X | X | X | X | X | X | X | X | ⎤ |
| 17 | B | X | X | X | X | X | X | X | X | X | X | X | X | X | X | X | B | X | X | ⎮ Cycle |
| 18 | B | X | X | X | X | X | X | X | X | X | X | X | X | X | X | X | B | B | X | ⎮ time |
| 19 | B | X | X | X | X | X | X | X | X | X | X | X | X | X | X | X | B | B | B | ⎦ 308.5 sec |

As clearly seen in Table 3, retrieving of a substrate from the subsequent lot B waits for 16 cycles after the last substrate was retrieved from the precedent lot A.

The through puts of the respective processing cycles of Tables 1 and 2 are calculated assuming that ten cassettes of the lot A and 1 cassette of the lot B are alternately and infinitely processed in succession. It is also assumed that each cassette 20 include 25 substrates 30. Under this condition, the through put time in the first preferred embodiment is calculated as $(15+321.25) \times 25 + 64.25 \times 25 \times 5 = 16437.5$ sec=274.0 min, whereas the through put time in the conventional processing is calculated as $64.25 \times 25 \times 10 = 308.5 \times 5 = 23775$ sec=396.25 min. Thus, the processing time is reduced by a time nearly 1/3 than in the conventional processing. In the calculation of the through put time in the first preferred embodiment, the term "$64.25 \times 25 \times 5$" means that 5 latter cassettes of the precedent lot A are successively processed after 1 cassette of the subsequent lot B was processed.

C. Structure of Substrate Processing Apparatus of Second Preferred Embodiment Unlike the apparatus of the first preferred embodiment, a substrate processing apparatus according to a second preferred embodiment does not calculate the cycle numbers $TC_A$ and $TC_B$ in advance during which the lots A and B can be successive processed. Rather, the substrate processing apparatus of the second preferred embodiment judges whether transportation of one of the lots A and B is allowable during transportation of the other. The substrate processing apparatus of the second preferred embodiment is otherwise almost the same as the substrate processing apparatus of the first preferred embodiment. The structure of the substrate processing apparatus of the second preferred embodiment is virtually the same as that shown in FIGS. 6 to 8. The only difference is the structure of the controller 50. For this reason, a detailed description regarding the structure of the substrate processing apparatus will be given while describing an operation of the substrate processing apparatus.

Figure 10:
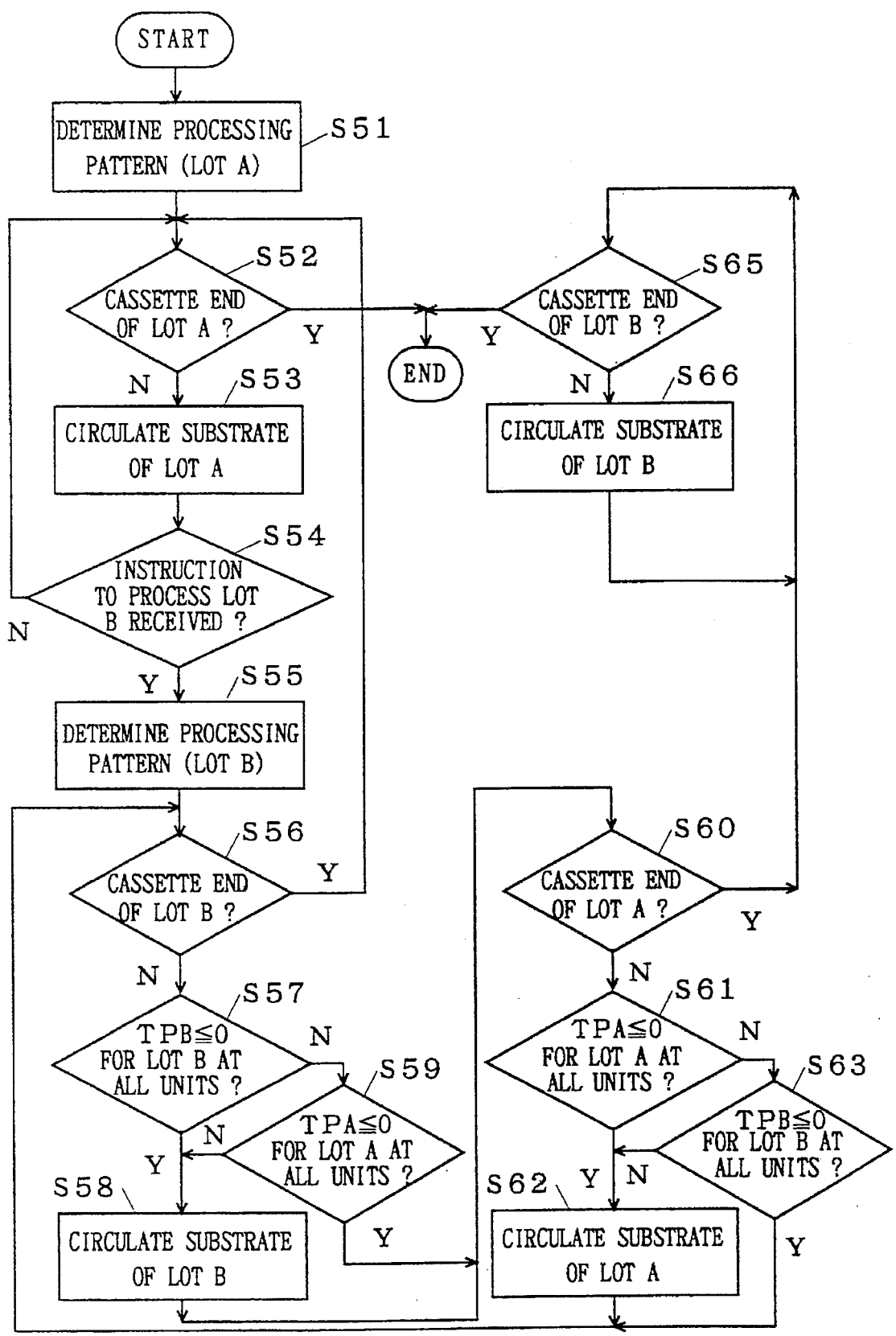
FIG. 10 is a flow chart of an operation of a substrate processing apparatus according to a second preferred embodiment of the present invention.

D. Operation of Substrate Processing Apparatus of Second Preferred Embodiment FIG. 10 is a flow chart of an operation of the substrate processing apparatus according to the second preferred embodiment. In the following, an operation of the substrate processing apparatus, and particularly procedures of transporting the substrates 30 will be described with reference to the flow chart in FIG. 10.

First, a pattern regarding the precedent lot A is determined (Step S51). More specifically, an operator enters the number of the cassettes 20 of the precedent lot A, the number of the substrates 30 contained in the cassettes 20, a wafer flow of the precedent lot A, processing conditions and etc at Step S51. If necessary, the operator inputs information regarding the arrangement of the substrate processing parts in the apparatus and information regarding the transport robot 10 on the keyboard 52.

Next, in accordance with the wafer flow of the precedent lot A, the processing condition and other information, parameters are calculated which are needed to successively process the substrates 30 of the cassettes 20 of the precedent lot A. For instance, the parameters determined here in accordance with the transportation orders of the substrates 30, the processing time and the like are a detailed operation routine of the transport robot 10, a detailed processing pattern at each substrate processing part (or unit) and a transportation cycle (cycle time) of circulating transportation of the substrates 30.

Following this, whether the current circulating transportation is the last circulation of the last substrate 30 of the precedent lot A is judged (Step S52). If YES, the processing on the precedent lot A completes.

If NO, the transport robot 10 which was waiting in front of the indexer IND starts one cycle of circulating transportation among the substrate processing parts in accordance with the processing conditions and the other parameters entered and determined at Step S51, to thereby perform processing of one step upon the substrates 30 of the precedent lot A. As a result, the first substrate 30 is retrieved from the cassette 20 of the precedent lot A to be ready for loading within the indexer IND. Step S54 is then executed to judge whether the operator has already given an instruction to process a substrate of the next lot B. If NO, the sequence returns to Step S52. Steps S52 to S54 are repeated if the current circulating transportation is not the last circulation of the last substrate 30 of the precedent lot A, thereby serially processing the substrates 30 of the precedent lot A. Each substrate 30 of the precedent lot A is processed in accordance with the predetermined wafer flow in this manner.

If the instruction to process a substrate of the next lot B is confirmed at Step S54, a pattern and the like for the subsequent lot B are determined (Step S55). That is, parameters are calculated which are needed to successively process the substrates 30 contained in the cassettes 20 of the subsequent lot B based on the wafer flow, the processing condition and the like regarding the subsequent lot B. For instance, the parameters determined here in accordance with the transportation orders of the substrates 30, the processing time and the like are a detailed operation routine of the transport robot 10, a detailed processing pattern at each substrate processing part (or unit) and etc. Further, parameters are determined which are necessary to interrupt circulating transportation for the precedent lot a and then perform circulating transportation for/he subsequent lot B, thereby concurrently processing the precedent and the subsequent lots A and B.

After calculating the necessary values at Step S55 in the manner as described above, Step S56 is executed to judge whether the current circulating transportation is the last circulation of the last substrate 30 of the subsequent lot B. If YES, deciding that the processing of the subsequent lot B is complete, the sequence returns to Step S52. This is repeated until the last circulation of the last substrate 30 of the precedent lot A is detected, thereby serially processing the remaining substrates 30 of the precedent lot A (Steps S52 to S54).

If it is judged at Step S56 that the current circulating transportation is not the last circulation of the last substrate 30 of the subsequent lot B, Step S57 is executed to judge whether an estimated remaining processing time $TP_B$ for the subsequent lot B is equal to or smaller than 0. If NO, whether an estimated remaining processing time $TP_A$ is equal to or smaller than 0 is judged (Step S59). If judged YES at Step S57 or if judged NO at Step S59, deciding that the substrates 30 of the precedent lot A need not be transported next, the sequence proceeds to Step S58 to circulate the substrates 30 of the subsequent lot B for one cycle by the transport robot 10 in accordance with the processing conditions and the other parameters entered and determined at Step S55, whereby the processing of the substrates 30 of the precedent lot B is advanced one cycle.

As described above, the estimated remaining processing times $TP_A$ and $TP_B$ are compared with the value 0 at Steps S57 and S59. The estimated remaining processing times are needed to determine whether there is a time left to insert a circulation of the lot A or B upon the current circulating transportation. These estimated remaining processing times are calculated immediately after an instruction to start circulating transportation of a substrate of the current lot (i.e., immediately after the transport robot 10 accessed the indexer). The estimated remaining processing times $TP_A$ and $TP_B$ are maximum values of remaining times $TP_{An}$ and $TP_{Bn}$ respectively.

$TP_{An}$=(Remaining processing time An)−(Returning time)−(n−1)× (1Step transportation time)

$TP_{Bn}$=(Remaining processing time Bn)−(Returning time)−(n−1)×(1 Step transportation time)

Remaining processing time An expresses a remaining time needed to complete the processing at a substrate processing part in which an n-th flow step of the wafer flow (including the indexer) of the lot A is performed, the lot A having a substrate which may be transported next time at Step 57. Remaining processing time Bn expresses a remaining time needed to complete the processing at a substrate processing part in which an n-th flow step of the wafer flow (including the indexer) of the lot B is performed, the lot B having a substrate which may be transported next time at Step 59. Returning time expresses a time needed for a substrate 30 retrieved from the indexer for a circulation to return to the indexer after the circulating transportation at Steps S57 and S59. Hence, by subtracting the returning times from the respective remaining processing times, actual remaining times are calculated which are left when the transport robot 10 has moved to the respective substrate processing parts which are included in the wafer flow of the lot A or B which may be transported next. If all remaining times $TP_{An}$ are smaller than 0 ($TP_A \leq 0$), deciding that there is an enough time to circulate the substrates 30 of the lot A next time, the substrates 30 of the lot A are circulated. If any of the remaining times $TP_{An}$ has a positive value ($TP_A > 0$), deciding that there is not an enough time to circulate the substrates 30 of the lot A next time, the substrates 30 of the lot A are not circulated. On the other hand, if all remaining times $TP_{Bn}$ are smaller than 0 ($TP_B \leq 0$), deciding that there is an enough time to circulate the substrates 30 of the lot B next time, the substrates 30 of the lot B are circulated. If any of the remaining times $TP_{Bn}$ has a positive value ($TP_B > 0$), deciding that there is not an enough time to circulate the substrates 30 of the lot B next time, the substrates 30 of the lot B are not circulated.

If the estimated remaining processing times $TP_A$ and $TP_B$ are both equal to or smaller than 0 or have positive values, substrates of the lot A are circulated when the currently circulated lot is the lot B and vice versa. That is, substrates contained in one of the lots A and B which requires a longer processing time are circulated at least once.

After advancing the processing of the substrates 30 of the subsequent lot B at Step S58, Step S60 is executed to judge whether the current circulating transportation is not the last circulation of the last substrate 30 of the precedent lot A. If judged NO at Step S60, Step S61 is executed to judge whether the estimated remaining processing time $TP_A$ for the lot A is equal to or smaller than 0. If NO, the sequence proceeds to Step S63 to judge whether the estimated remaining processing time $TP_B$ is equal to or smaller than 0. If it is judged at Step S61 that the estimated remaining processing time $TP_A$ is equal to or smaller than 0 and if it is judged at Step S63 that the estimated remaining processing time $TP_B$ is larger than 0, deciding that the substrates 30 of the subsequent lot B need not be transported next, the sequence proceeds to Step S62 to circulate the substrates 30 of the precedent lot A for one cycle by the transport robot 10 in accordance with the processing conditions and the other parameters entered and determined at Step S51, whereby the processing of the substrates 30 of the precedent lot A is advanced one cycle.

After advancing the processing of the substrates 30 of the precedent lot A one cycle at Step S62, or if it is judged at Step S63 that the estimated remaining processing time $TP_A$ is equal to or smaller than 0, Step S56 is executed to judge whether the current circulating transportation is the last circulation of the last substrate 30 of the subsequent lot B. If NO, whether the estimated remaining processing time $TP_A$ is equal to or smaller than 0 is judged (Step S57) and whether the estimated remaining processing time $TP_A$ is equal to or smaller than 0 is judged (Step S59). If judged YES at Step S57 or if judged NO at Step S59, deciding that the substrates 30 of the precedent lot A need not be transported next, the sequence proceeds to Step S58 to circulate the substrates 30 of the subsequent lot B for one cycle by the transport robot 10 in accordance with the processing conditions and the other parameters entered and determined at Step S55, whereby the processing of the substrates 30 of the subsequent lot B is advanced one cycle.

After advancing the processing of the substrates 30 of the subsequent lot B is advanced one cycle at Step S58, or if it is judged at Step S59 that the estimated remaining processing time $TP_A$ is equal to or smaller than 0, Step S60 is executed to judge whether the current circulating transportation is the last circulation of the last substrate 30 of the precedent lot A. If NO, Steps S61, S62 and S63 are repeated. Upon detection of the last circulation of the last substrate 30 of the precedent lot A, deciding that the processing upon the precedent lot A is complete, the sequence proceeds to Step S65. Steps 65 and S66 are repeated to serially process the remaining substrates 30 of the subsequent lot B until the last circulation of the last substrate 30 of the subsequent lot B is detected.

E. Structure of Substrate Processing Apparatus of Third Preferred Embodiment A substrate processing apparatus according to a third preferred embodiment does not always perform the double flow processing which is performed in the first and the second preferred embodiments. Rather, it is possible in the third preferred embodiment to select flex flow processing which advances the retrieving timing of retrieving a substrate from a subsequent lot if needed. The substrate processing apparatus of the third preferred embodiment is otherwise almost the same as the substrate processing apparatuses of the first and the second preferred embodiments. The structure of the substrate processing apparatus of the third preferred embodiment is virtually the same as that shown in FIGS. 6 to 8. The only difference is the structure of the controller 50. For this reason, a detailed description regarding the structure of the substrate processing apparatus will be given while describing an operation of the substrate processing apparatus.

Figure 11:
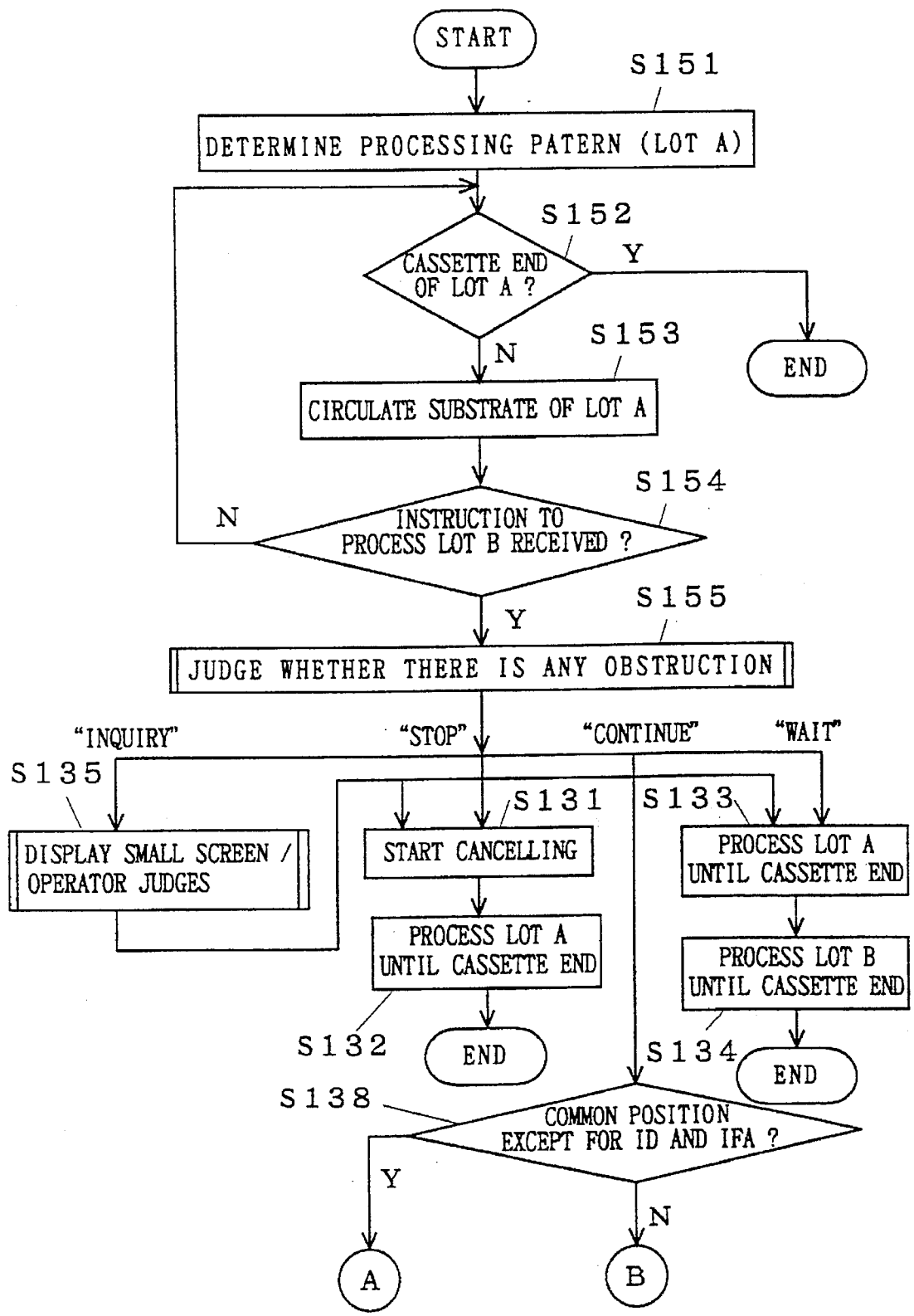
FIGS. 11 and 12 are flow charts showing calculation of a loading wait cycle in the substrate processing apparatus according to a third preferred embodiment of the present invention.
Figure 12:
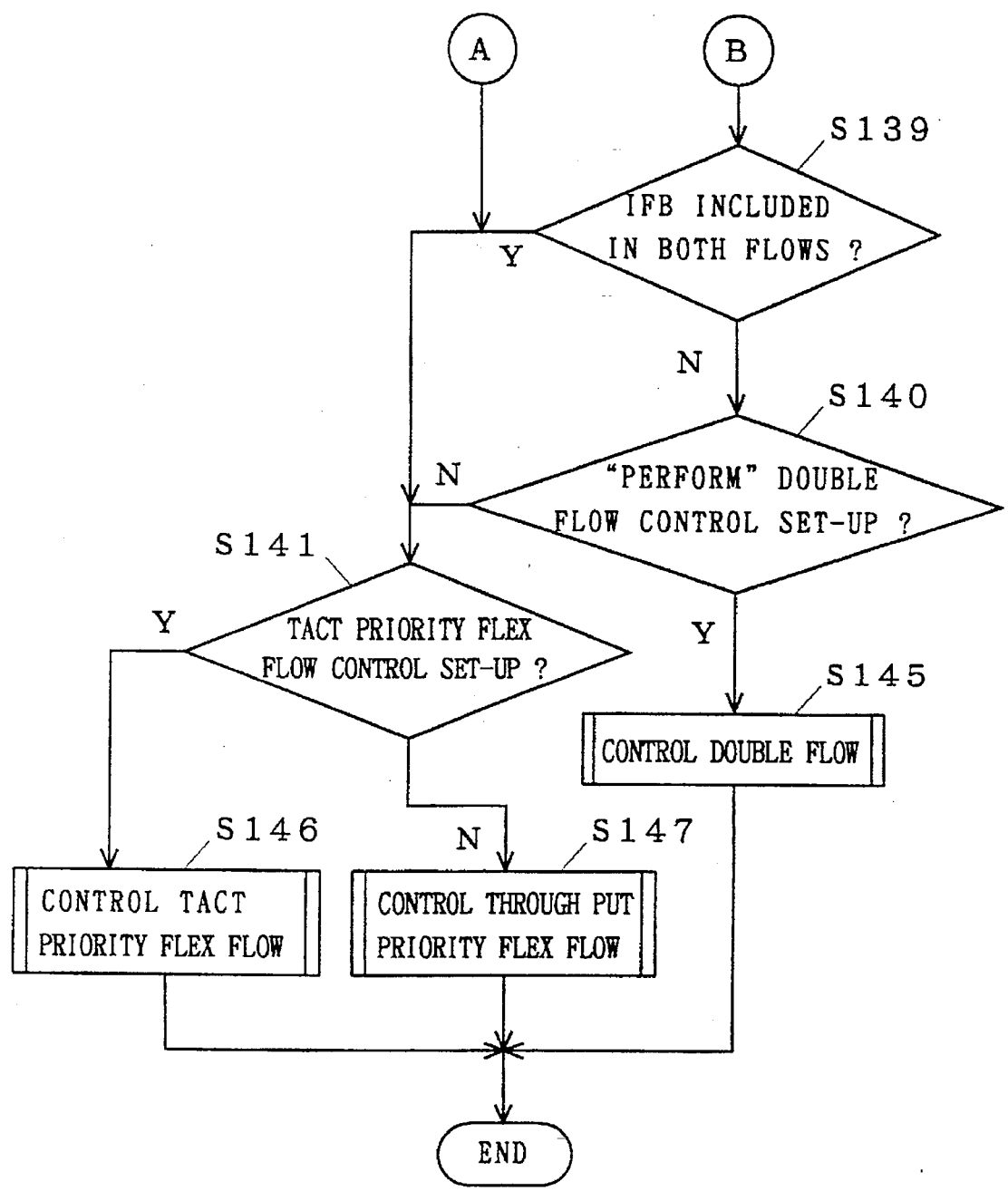

F. Operation of Substrate Processing Apparatus of Third Preferred Embodiment FIGS. 11 and 12 are flow charts showing an operation of the substrate processing apparatus of the third preferred embodiment. In the following, an operation of the substrate processing apparatus, and particularly procedures of transporting the substrates 30 will be described with reference to the flow charts.

First, a pattern regarding the precedent lot A is determined (Step S151). More specifically, an operator enters the number of the cassettes 20 of the precedent lot A, the number of the substrates 30 contained in the cassettes 20, a wafer flow of the precedent lot A, processing conditions and etc at Step S151. If necessary, tie operator inputs information regarding the arrangement of the substrate processing parts in the apparatus and information regarding the transport robot 10 on the keyboard 52. Further, in accordance with the wafer flow of the precedent lot A, the processing condition and other information, parameters are calculated which are needed to successively process the substrates 30 of the cassettes 20 of the precedent lot A.

Next, whether the current circulating transportation is the last circulation of the last substrate 30 of the precedent lot A is judged (Step S152). If YES, the processing on the precedent lot A completes.

If NO, the transport robot 10 which was waiting in front of the indexer IND starts one cycle of circulating transportation among the substrate processing parts in accordance with the processing conditions and the other parameters entered and determined at Step S151, to thereby perform processing of one step upon the substrates 30 of the precedent lot A. As a result, the first substrate 30 is retrieved from the cassette 20 of the precedent lot A to be ready for loading within the indexer IND. Step S154 is then executed to judge whether the operator has already given an instruction to process a substrate of the next lot B. If NO, the sequence returns to Step S152. Steps S152 to S154 are repeated if the current circulating transportation is not the last circulation of the last substrate 30 of the precedent lot A, thereby serially processing the substrates 30 of the precedent lot A. Each substrate 30 of the precedent lot A is processed in accordance with the predetermined wafer flow in this manner.

If the instruction to process a substrate of the next lot B is confirmed at Step S154, Step S155 is executed to determine parameters which are needed to successively process the substrates 30 contained in the cassettes 20 of the subsequent lot B based on the wafer flow, the processing condition and the like regarding the subsequent lot B, thereafter to judge whether there is any obstruction to retrieving of a substrate from the subsequent lot B, and lastly to select one of preliminarily determined operation modes "Stop," "Wait," "Inquiry" and "Continue." Obstructions to retrieving of a substrate from the subsequent lot B include a difference between the wafer flow of the lot A and that of the lot B and a difference between a heating time upon the lot A and that upon the lot B.

If "Stop" is selected, the instruction to retrieve a substrate from the subsequent lot B is cancelled (Step S131). The processing of substrates 30 of the precedent lot A is continued, all remaining substrates 30 of the lot A are circulated, and the processing upon the precedent lot A completes (Step S132).

If "Wait" is selected, the processing of substrates 30 of the precedent lot A is continued, all remaining substrates 30 of the lot A are circulated, and the processing upon the precedent lot A completes (Step S133). Processing upon the subsequent lot B is performed immediately after this until all substrates 30 of the lot B are circulated and the processing upon the precedent lot B completes (Step S134).

If "Inquiry" is selected, Step S135 is executed to indicate a difference between the wafer flow of the lot A and that of the lot B and other obstruction to retrieving of a substrate from the subsequent lot B, e.g., a problem in double flow or flex flow processing and a restriction that it is impossible to shorten a wafer flow processing time or to perform tact management. At Step S135, the again further selects between the modes "Stop," "Wait" and "Continue."

If "Stop" or "Wait" is selected, the sequence proceeds to Step S131 or Step S133, respectively.

If "Continue" is selected, Steps S138 to S141 are executed to judge which one between double flow successive processing and flex flow successive processing should be selected.

At Step S138, whether there is any other common position between the wafer flows of the two lots A and B in addition to the indexer IND is judged. If there is other common position in addition to the indexer IND, the sequence proceeds to Step S141. If there is no other common position in addition to the indexer IND, the sequence proceeds to Step S139. Flex flow processing is possible if there is other common position in addition to the indexer IND, although double flow processing is impossible to obviate contention for the common position as described earlier. Conversely, double flow processing is possible if there is no other common position in addition to the indexer IND. In flex flow processing with no other common position in addition to the indexer IND, the through put may not be sufficiently improved depending on the contents of the wafer flows of the lots A and B. When the substrate processing apparatus includes an interface apparatus (IFA), the interface apparatus is treated similarly to the indexer IND since the function of the interface apparatus is the same as that of the indexer IND.

At Step S139, whether the wafer flows of the lots A and B both include the interface apparatus (IF-B) is judged. The sequence proceeds to Step S140 if one of the wafer flows does not include the interface apparatus (IF-B). The sequence proceeds to Step S141 if the wafer flows both include the interface apparatus (IF-B). When the wafer flows both include the interface apparatus (IF-B), double flow processing is avoided to obviate contention for the interface apparatus (IF-B).

Whether to perform double flow processing is inquired to the operator at Step 140. In principle, double flow processing promises a better through put than flex flow processing if there is no other common position in addition to the indexer IND. However, perfect tact management is impossible in double flow processing. As herein termed, "tact management" refers is to control a time constant in which the transport robot 10 starts one cycle of circulating transportation at a certain substrate processing part and circulates among the substrate processing parts while performing a certain operation until the transport robot 10 starts the next cycle of circulating transportation at the same substrate processing part where the previous cycle of circulating transportation was started. Tact management keeps heat histories of substrates constant.

If double flow processing is selected at Step S140, Step S145 is executed to perform double flow processing. Since the content of double flow processing is the same as that shown in the flow chart described in relation to the first or the second preferred embodiment (FIG. 9 or FIG. 10), the content of double flow processing will not be described in detail. The processing starts at Step S5 in FIG. 9 but at Step 55 in FIG. 10.

If flex flow processing is selected at Step S140 or other steps, whether tact management is given priority is inquired to the operator again at Step S141. If YES, Step S146 is executed to perform tact priority flex flow processing as described below in detail. If NO, Step S147 is executed to perform through put priority flex flow processing as described below in detail.

Figure 13:
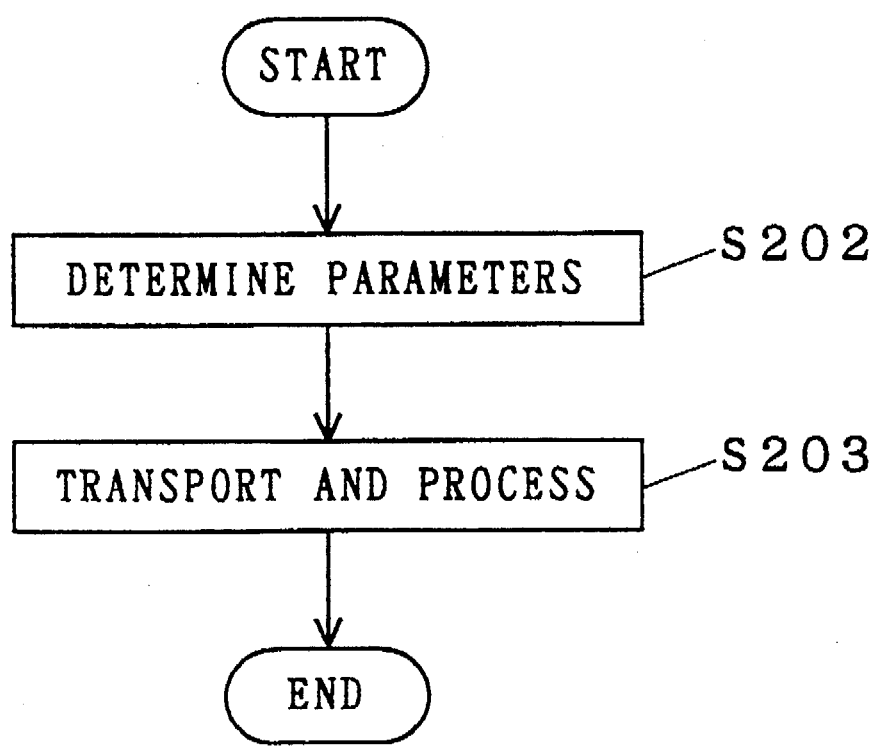
FIG. 13 is a detail showing a part of FIG. 12.

FIG. 13 is a flow chart of an operation of the substrate processing apparatus performing tact priority flex flow processing. In tact priority flex flow processing, the substrate processing apparatus successively processes substrates of lots which have different flows from each other while performing tact management. In the following, an operation of the substrate processing apparatus, and particularly procedures of transporting the substrates 30 will be described with reference to the flow charts.

First, from the information inputted in advance regarding the precedent and the subsequent lots A and B, values are determined which are necessary to successively process the substrates 30 of the pair of the lots A and B (Step S202). The values determined here include a tact time $T_2$ of the wafer flow of the lot B, a processing position difference Pd between the flows of the lots A and B, a maximum flow step difference Fs between the lots A and B, and a loading wait cycle W, i.e., a larger one of the processing position difference Pd and the maximum flow step difference Fs. If necessary, in accordance with the transportation orders of the substrates 30, the processing time and the like, a detailed operation routine of the transport robot 10, a detailed processing pattern at each substrate processing part (or unit) and etc. are determined. Next, the substrates of the cassettes 20 are each transported in a predetermined order in accordance with the values determined at Step S202 while processed by predetermined treatments (Step S203). If needed, retrieving of a substrate from the subsequent lot B is suspended appropriately when processing upon the precedent lot A and processing upon the lot B are linked to each other, thereby preventing the processing upon the lot B from interfering the processing upon the precedent lot A.

Figure 14:
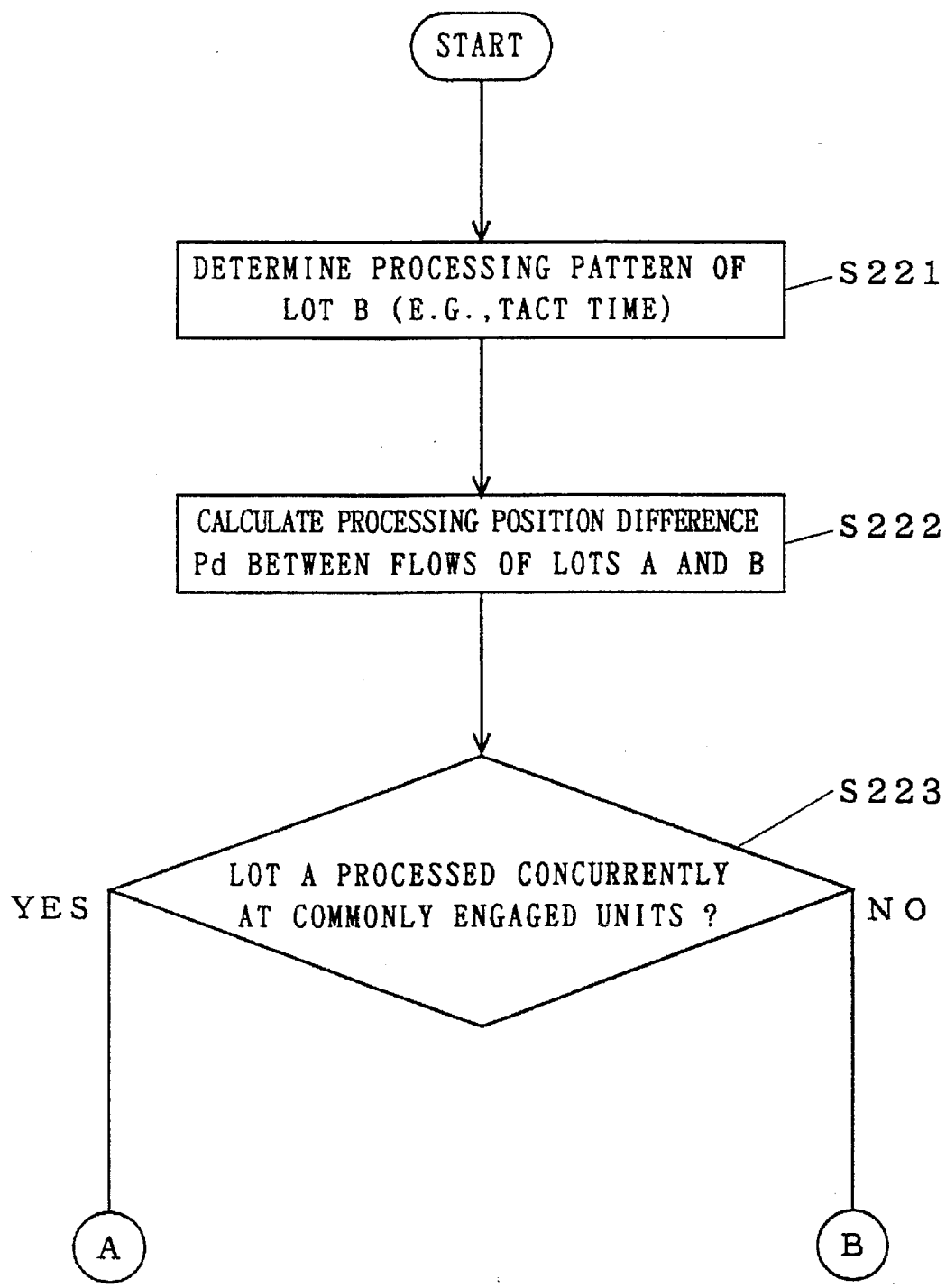
FIGS. 14 and 15 are flow charts showing calculation of a loading wait cycle in FIG. 13.
Figure 15:
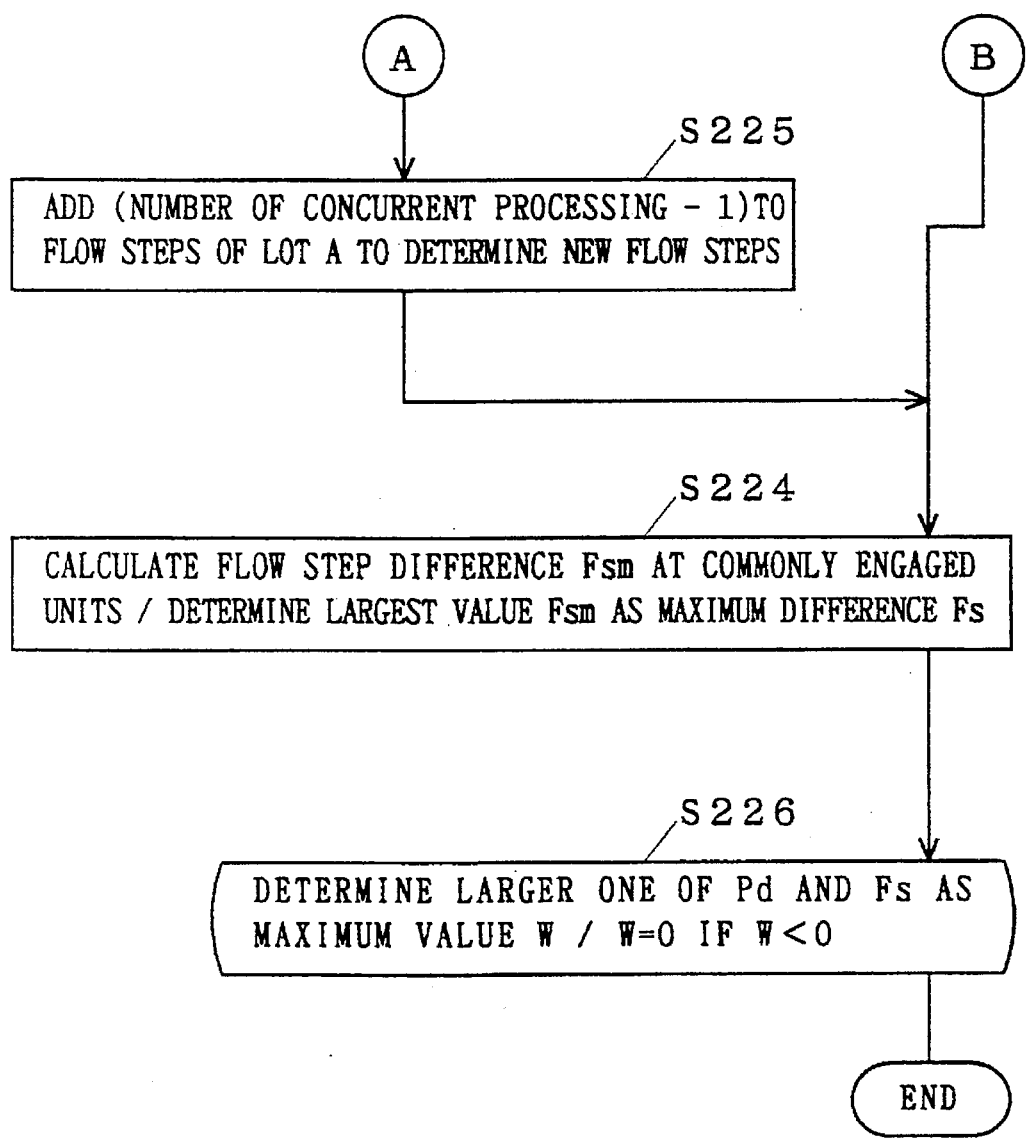

FIGS. 14 and 15 are flow chars showing Step S202 in detail. First, at Step S221, the tact time $T_2$ and the like of the lot B are determined in accordance with the information already entered such as the transportation orders of the substrates 30, the processing time. Since already determined when the processing upon the precedent lot A started, a tact time $T_1$ of the lot A needs not be determined here. As herein termed, "tact time" is a cycle of a series of repeated operations (circulation) for transporting the substrate 30, which is currently in a cycle of treatments starting at the indexer IND and ending back at the indexer IND according to the wafer flow, from one treatment to the next by the transport robot 10. In other words, the tact line $T_n$ is a time from the start of one cycle of operation by the transport robot 10 at a certain substrate processing part until the start of another cycle of operation by the transport robot 10 at the same substrate processing part where the previous cycle of operation is started. A tact time coincides with a through put time of where the substrates 30 which are to be processed in the same wafer flow are successively loaded and the substrate processing apparatus is operated successively and infinitely to process the substrates. In determining the tact time $T_2$, whether the rate of wafer flow is restricted by a transportation time or by a processing time at each substrate processing part is determined first from the transportation order, a processing time and etc. In accordance with the result, a total processing time of the wafer flow is then reduced minimum (The tact time is the same as the through put time in tact management in flex flow processing.). The manner in which the tact time $T_2$ is determined is the same as in the conventional technique, and therefore, will not be described in detail here.

Next, the processing position difference Pd between a pair of successive lots A and B is determined (Step S222). The processing position difference Pd is defined by a difference in the number (i.e., position number) of the substrate processing parts (or units) to be engaged with between the lots A and B. If this difference has a negative value, the processing position difference Pd is determined as 0. Instead of including an operation of the indexer IND in the position number as in the first preferred embodiment, the operation of the indexer IND may not be included in the position number. The processing position difference Pd is calculated to prevent a substrate of the subsequent lot B from passing a substrate of the precedent lot A. More precisely, where the position number of the subsequent lot B is less than the position number of the precedent lot A, a substrate of the subsequent lot B interferes with a substrate of the precedent lot A when passing, whereby tact management becomes impossible or the wafer flows of the two lots A and B get confused, unless the start of processing of the subsequent lot B does not wait for a time which is expressed by the difference in the number of the cycles.

Tables 4 and 5 below shows examples of calculation of the processing position difference Pd. The wafer flow of Table 4 corresponds to where not all of the hot plates are engaged with and therefore different hot plates are used between the successive two lots A and B to change the temperature condition between the two lots. The wafer flow of Table 5 corresponds to where a specific treatment is not needed for the subsequent lot B.

TABLE 4

| Flow of Lot A | (1) IND -- (L) | (2) HP1 -- | (3) CP --- | (4) SC --- | (5) HP 2 -- | (6) IND (UL) |
|---|---|---|---|---|---|---|
| Flow of Lot B | (1) IND -- (L) | (2) HP1 -- | (3) CP --- | (4) SC --- | (5) HP 3 -- | (6) IND (UL) |

TABLE 5

| Flow of Lot A | (1) IND -- (L) | (2) HP1 -- | (3) CP --- | (4) SC --- | (5) HP2 --- | (6) IND (UL) |
|---|---|---|---|---|---|---|
| Flow of Lot B | (1) IND ---------------- (L) | (2) | (3) | (4) SC --- | (5) HP3 --- | (6) IND (UL) |

In Tables 4 and 5, the underlined portion is where the lots A and B undergo different treatments from each other.

In the case of the lots A and B of Table 4, the total position numbers in the wafer flows are 6 for the both lots so that processing position difference Pd=0. In the case of the lots A and B of Table 5, the total position numbers in the wafer flows are 6 and 4 for the respective cassettes so that processing position difference Pd=2.

Next, as shown in FIG. 14, Step S223 is executed to judge whether the substrates of the precedent lot A are processed parallel at the substrate processing parts (or units) which are commonly engaged with in the wafer flows by the lots A and B. As described in detail below, this is to prevent contention between substrates of the subsequent lot B and the precedent lot A at the substrate processing pans (or units) where concurrent processing is performed.

If there is no concurrent processing, Step S224 is performed to find the maximum flow step difference Fs between the wafer flows of the lots A and B as shown in FIG. 15. The maximum flow step difference Fs is defined as a maximum difference (a flow step difference $F_{sm}$) in the orders (i.e., flow steps) of the substrate processing parts (or units) which are commonly engaged with by the lots A and B. It is assumed that $F_{sm}$=0 when the flow step difference $F_{sm}$ has a negative value. Instead of retrieving of a substrate from the indexer IND in the flow steps, unlike herein described, retrieving of a substrate from the indexer IND may not be included in the flow steps. The maximum flow step difference Fs is calculated principally to prevent contention between processing of a substrate of the subsequent lot B and processing of a substrate of the precedent lot A, or to prevent the processing of a substrate of the subsequent lot B from passing the processing of a substrate of the precedent lot A. In other words, when there is a substrate processing part where the flow steps for the subsequent lot B are less than that of the precedent lot A, contention or interference between substrates of the lots A and B is created, thereby making tact management impossible, unless the processing of the subsequent lot B does not wait for a time which is expressed by the maximum difference or longer.

Tables 6 and 7 below show a manner in which the flow step difference $F_{sm}$ and the maximum flow step difference Fs are calculated.

TABLE 6

| Flow of Lot A | IND --- a --- b --- d --- e --- f ------ IND |
|---|---|
| | (L) (UL) |
| Flow of Lot B | IND --- a --- b --- d --- e ------ g --- IND |
| | (L) (UL) |

The wafer flows of the pair of the lots A and B is shown in Table 6. The symbols α to g represent treatments at the respective substrate processing parts (or units).

TABLE 7

| | | | Processing unit | | | | | |
|---|---|---|---|---|---|---|---|---|
| | IND (L) | a | b | c | d | e | f | g | IND (UL) |
| Flow Step of Lot A | 1 | a1 | b1 | c1 | d1 | e1 | f1 | — | (x) |
| Flow Step of Lot B | 1 | a2 | b2 | c2 | d2 | e2 | — | g2 | (y) |
| Flow Step Difference $F_{sm}$ | 0 | a1 – a2 | b1 – b2 | c1 – c2 | d1 – d2 | e1 – e2 | 0 | 0 | (x – y) |

Table 7 shows the flow steps of the pair of the lots A and B. The symbols α1 to f1 represent the flow steps of the precedent cassette (n) while the symbols α2 to g2 represent the flow steps of the subsequent lot B. The symbols x and y denote the position numbers.

In the case of the pair of the lots A and B shown in Tables 6 and 7, the flow step difference $F_{sm}$ is calculated as 0, (a1–a2), (b1–b2), . . . Hence, the largest one of the values 0, (a1–a2), (b1–b2), . . . is the maximum flow step difference Fs. For convenience, the flow step difference $F_{sm}$ is determined as 0 if there is no treatment to be performed.

Hyphen denotes that there is not a treatment to be performed at the substrate processing parts (or units).

In the case of the pair of the lots A and B shown in Table 6, the flow step differences $F_{sm}$ are calculated as 0, (a1–a2), (b1–b2), . . . Hence, the largest one of the values 0, (a1–a2), (b1–b2), . . . is the maximum flow step difference Fs. For convenience, the flow step difference $F_{sm}$ is determined as 0 if the processing is not concurrent processing. The symbol (x–y) defines the processing position difference Pd.

Tables 8 and 9 below show a manner in which the flow step differences $F_{sm}$ and the maximum flow step difference Fs are calculated.

TABLE 8

| Flow of Lot A | IND (L) | - a -- b -- c -- d ------ | IND (UL) |
| Flow of Lot B | IND (L) | ------- c -- d ------ | IND (UL) |

An example of the wafer flows of the pair of the lots A and B is shown in Table 8.

TABLE 9

| | | Processing unit | | | | | | |
|---|---|---|---|---|---|---|---|---|
| | IND (L) | a | b | c | d | e | f f | g g | IND (UL) |
| Flow Step of Lot A | 1 | 2 | 3 | 4 | 5 | — | — | — | (6) |
| Flow Step of Lot B | 1 | — | — | 2 | 3 | — | — | — | (4) |
| Flow Step Difference $F_{sm}$ | 0 | 0 | 0 | 2 | 2 | — | — | — | (2) |

An example of calculation of the flow steps and the like of the lots A and B is shown in Table 9. As clearly seen in Table 9, the flow step differences $F_{sm}$ are 0 or 2 and the maximum flow step difference Fs is 2.

As shown in FIG. 15, when there is concurrent processing, of the flow steps which are found in the same manner as in the case of where concurrent processing is not performed, a value (the number of concurrent processing—1) is added to those which are related to the substrate processing parts (or units) in which concurrent processing is performed, to thereby determine new flow steps (Step S225). Following this, the flow step differences $F_{sm}$ are calculated as differences in the flow steps, and the flow step difference $F_{sm}$ which has the largest value is determined as the maximum flow step difference Fs (Step S224). As described above, the maximum flow step difference Fs is found using the new flow steps which are defined by adding the value (the number of concurrent processing—1) with respect to the substrate processing parts (or units) in which concurrent processing is performed. This is to prevent contention between processing of a substrate of the subsequent lot B and processing of a substrate of the precedent lot A at the substrate processing parts (or units) in which concurrent processing is performed. The term "–1" aims at preventing possible interference between the two lots A and B even when it is unknown which substrate processing part (or unit) performing concurrent processing still contains the last substrate of the lot A.

Tables 10 to 12 below show examples of calculation of the flow step differences $F_{sm}$ and the maximum flow step difference Fs.

TABLE 10

| Flow of Lot A | IND (L) | ┌─ a<br>── b -- d -- e -- f -- g --<br>└─ c | IND (UL) |
| Flow of Lot B | IND (L) | IND -- f -- g -- e -- a ------ | IND (UL) |

Table 10 shows an example of the wafer flows of the pair of the lots A and B. Concurrent processing is performed at the beginning for the lot A as denoted as a, b and c. This is where contention with the last treatment a for the subsequent lot B might occur.

TABLE 11

| | | Processing unit | | | | | | | |
|---|---|---|---|---|---|---|---|---|---|
| | IND (L) | a | b | c | d | e | f | g | IND (UL) |
| Flow Step of Lot A | 1 | 2<br>(4) | 2<br>(4) | 2<br>(4) | 5 | 6 | 7 | 8 | |

(After adding (the number of concurrent processing –1))

| Flow step of Lot B | 1 | 5 | — | — | — | 4 | 2 | 3 | |
| Flow Step Difference $F_{sm}$ | 0 | 0 | 0 | 0 | — | 2 | 5 | 5 | |

Table 11 shows an example of calculation of the flow steps and the like of the lots A and B. As clearly seen in Table 11, the flow step differences $F_{sm}$ are 0, 2 or 5 and the maximum flow step difference $F_{sm}$ is 5. The figures in parentheses regarding the flow steps of the lot A correspond to the new flow step which is obtained by adding the value (the number of concurrent processing–1) with respect to the substrate processing parts (or units) performing concurrent processing.

TABLE 12

| | | Processing unit | | | | | | | |
|---|---|---|---|---|---|---|---|---|---|
| | IND (L) | a | b | c | d | e | f | g | IND (UL) |
| Flow Step of Lot A | 1 | 5 | — | — | — | 4 | 2 | 3 | |
| Flow step of Lot B | 1 | 2 | 2 | 2 | 5 | 6 | 7 | 8 | |
| Flow Step Difference $F_{sm}$ | 0 | 3 | — | — | — | 0 | 0 | 0 | |

Table 12 shows an example of calculation of the flow steps and the like of the pair of the lots A and B. Between Tables 10 and 12, the flow step of one of the lots is replaced with that of the other. In Table 12, it is not necessary to add the value (the number of concurrent processing–1) to the flow steps which are related to the substrate processing parts (or units) performing concurrent processing. As clearly seen in Table 12, the flow step differences $F_{sm}$ are 0 or 3 and the maximum flow step difference Fs is 3.

Lastly, as shown in FIG. 15, the larger one between the processing position difference Pd and the maximum flow step difference Fs is determined as a maximum value W (Step S226). The maximum value W expresses the number of circulations during which retrieving of a substrate from the subsequent lot B must be restricted to prevent contention between substrates of the two lots A and B. That is, the maximum value W expresses a loading wait cycle.

Figure 16:
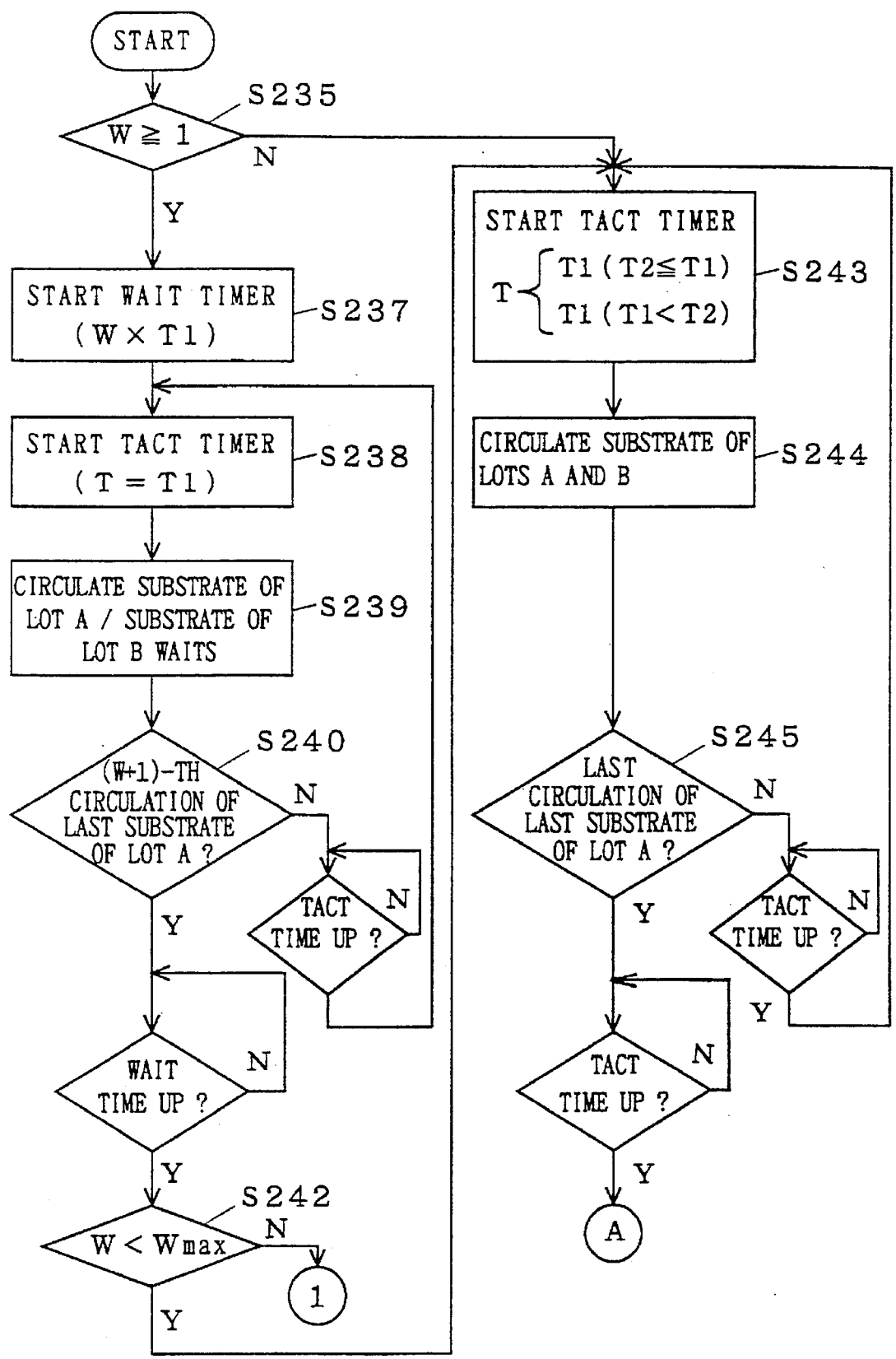
FIGS. 16 and 17 are flow charts showing transportation, suspension of loading and the like of substrates of FIG. 13.
Figure 17:
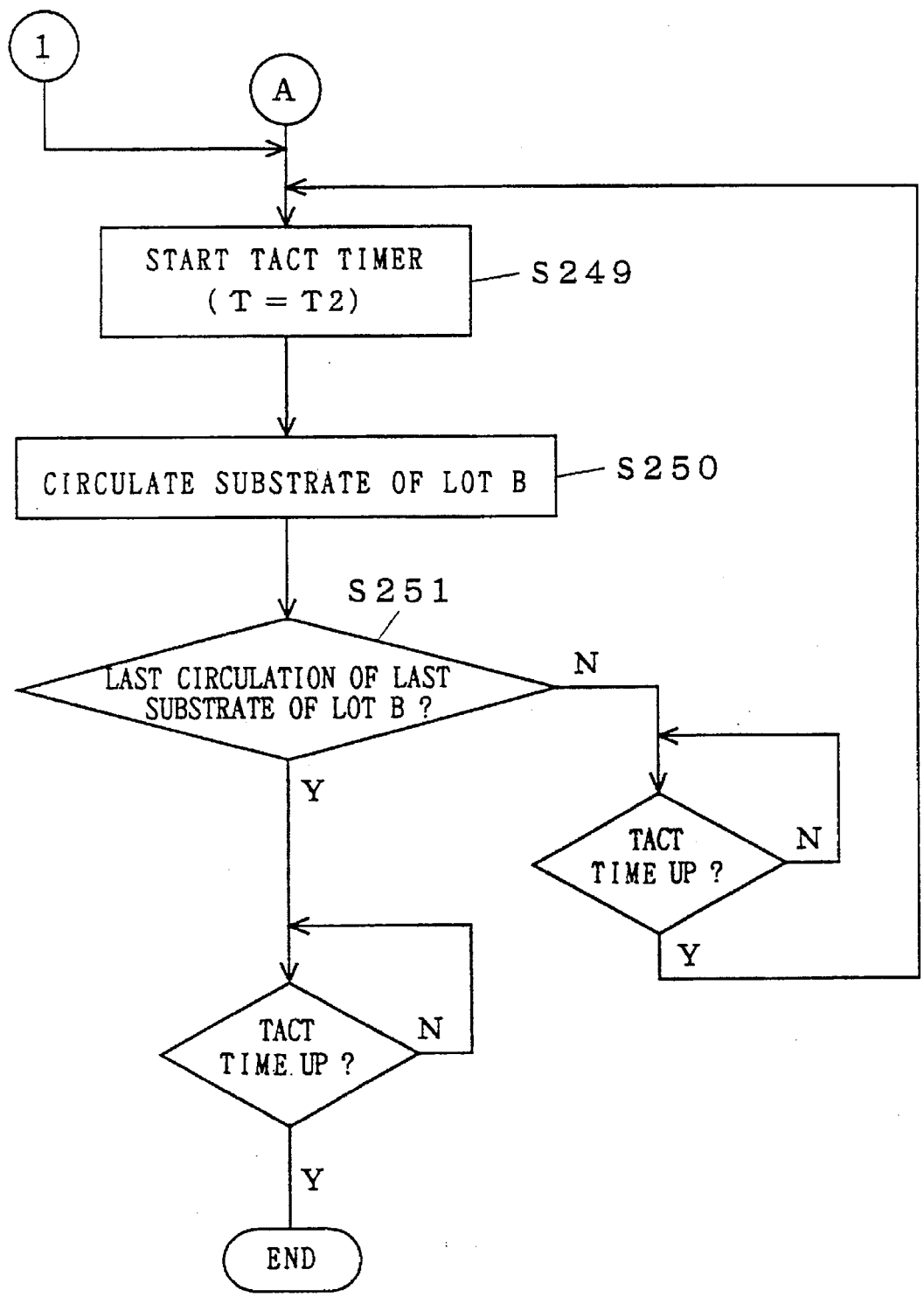

FIGS. 16 and 17 are flow charts showing Step S203 of FIG. 11 in more detail. Under tact management and in accordance of wafer flows determined in advance and various processing conditions, the substrates 30 of each cassette are transported and processed in predetermined orders.

First, whether a loading wait cycle W is equal to or larger than 1 is judged (Step S235). A wait timer having a tact time of W×T$_1$ is started if it is judged at Step S235 that the loading wait cycle W is equal to or larger than 1 and retrieving from the lot B must be restricted (Step S237). The tact timer having a tact time of T$_1$ is then started (Step S238). Next, one cycle of circulating transportation of the substrates 30 of the lot B is started (Step S239), whereby suspending the lot B in a waiting state. Following this, it is judged whether the current circulating transportation is a (W+1)-th cycle of circulation of the last substrate 30 of the lot A (Step S240). If NO, the sequence waits for the tact time T$_1$ and returns to Step S238. This is repeated to process the last substrates 30 of the lot A.

If the (W+1)-th cycle of circulation of the last substrate 30 is detected at Step S240, the sequence waits for a wait time W$_1$×T$_1$ so that the substrates 30 of the lot B are released from the waiting state. Next, it is judged whether the loading wait cycle W is shorter than a standard wait cycle Wmax (Step S242). The standard wait cycle Wmax is the number of cycles during which processing of the lot B is suspended until the processing of the lot A completes. In this example, the standard wait cycle Wmax is equal to 1 subtracted from the total position number of the wafer flows of the lot A (including the indexer IND).

The tact timer is started if it is judged that the loading wait cycle W is shorter than the standard wait cycle Wmax (Step S243). As the tact time T, a longer one of the tact times T$_1$ and T$_2$ is selected. Next, one cycle of circulating of the substrates 30 of the lots A and B is started (Step S244). At this stage, the transport robot 10 moves to circulate each substrate 30 of the lots A and B. In other words, the transport robot 10 moves around, accessing all substrate processing parts (or units) which are to be engaged with in the wafer flows of the lots A and B. It is then judged whether the current circulating transportation is the last cycle of circulation of the last substrate 30 of the lot A (Step S245). If NO, the sequence waits for the tact time T$_1$ and returns to Step S243. This is repeated to serially and concurrently process the substrates 30 of the lots A and B.

If the last cycle of circulation of the last substrate 30 of the lot A is detected at Step S245, the sequence waits for the tact time T and the tact timer is started (Step S249). Next, the transport robot 10 performs one cycle of circulating transportation of the remaining substrates 30 of the lot B (Step S250). Whether the current circulating transportation is the last cycle of circulating transportation of the last substrate 30 of the lot B is then judged (Step S251). Since NO, the sequence waits for the tact time T$_2$ and returns to Step S249. This is repeated to serially process the remaining substrates 30 of the lot B. If the last cycle of circulating transportation of the last substrate 30 of the lot B is detected at Step S251, the sequence waits for the tact time T$_2$ and ends.

If it is judged at Step S235 that the loading wait cycle W is smaller than 1 (that is, equal to 0) so that retrieving of a substrate from the lot B is not to be restricted, the sequence proceeds to Step S243 to start the tact timer. Following this, Step S244 is executed to start one cycle of circulating transportation of the remaining substrates 30 of the lot A and the first substrate 30 of the lot B. Next, Step S245 is executed to judge whether the current circulating transportation is the last cycle of circulating transportation of the last substrate 30 of the lot A. If NO, the sequence waits for the tact time T and returns to Step S243. This is repeated until the last cycle of circulating transportation of the last substrate 30 of the lot A is detected. Upon detection, the sequence waits for the tact time T and proceeds to Step S249. Steps S249 to S251, similar to the operations where retrieving from the lot B is restricted, will not be described here.

If it is judged at Step S242 that the loading wait cycle W is equal to Wmax, determining that retrieving from the lot B must be restricted until processing of the lot A completes, the sequence proceeds to Step S249 to process the substrates of the lot B.

In the following, a specific example of an operation of the substrate processing apparatus performing flex flow processing will be described.

Table 13 shows wafer processing cycles during a transition from one flow to another different flow where the apparatus successively processes the substrates of the pair of the lots A and B of Table 4 having different flows from each other. Table 13 shows whether the substrates 30 are present in the substrate processing parts (or units) after one unprocessed substrate 30 retrieved from a wafer loading position of/he indexer IND and circulated by the transport robot 10 returns to the indexer IND.

TABLE 13

Wafer Processing Cycle in Flex Flow Processing

| Lot A | (1) IND | (2) HP1 | (3) CP | (4) SC | (5) HP2 | HP3 | (6) IND |
|---|---|---|---|---|---|---|---|
| Lot B | (1) | (2) | (3) | (4) |  | (5) | (6) |

| Processing Cycle | | | | | | | |
|---|---|---|---|---|---|---|---|
| 1 | B | [A] | A | A | A | X | A |
| *Lot B is started immediately after the cassette end wafer [A] of lot A is started. | | | | | | | |
| 2 | B | B | [A] | A | A | X | A |
| 3 | B | B | B | [A] | A | X | A |
| 4 | B | B | B | B | [A] | X | A |
| 5 | B | B | B | B | X | B | [A] |
| *Cassette end wafer [A] is transferred to IND. | | | | | | | |
| 6 | B | B | B | B | X | B | B |
| *Wafer of lot B is transferred to IND without a break between cycles. | | | | | | | |

As clearly seen in Table 13, the substrates of the lots A and B having different flows are processed successively without a break. Hence, a time loss is eliminated which is created where retrieving of a substrate from the subsequent lot B is temporarily suspended.

Table 14 below shows wafer processing cycles of the conventional apparatus during successive processing of the substrates of the pair of the lots A and B of Table 4 having different flows from each other.

TABLE 14

Conventional Wafer Processing Cycle

| Lot A | (1) IND | (2) HP1 | (3) CP | (4) SC | (5) HP2 | HP3 | (6) IND |
|---|---|---|---|---|---|---|---|
| Lot B | (1) | (2) | (3) | (4) |  | (5) | (6) |

| Processing Cycle | | | | | | | |
|---|---|---|---|---|---|---|---|
| 1 | [A] | A | A | A | A | X | A |
| 2 | X | [A] | A | A | A | X | A |
| 3 | X | X | [A] | A | A | X | A |
| 4 | X | X | X | [A) | A | X | A |
| 5 | X | X | X | X | [A] | X | A |
| 6 | X | X | X | X | X | X | [A] |
| *Cassette end wafer [A] is transferred to IND. | | | | | | | |
| 7 | B | X | X | X | X | X | X |
| *Lot B is started after the cassette end wafer is returned to the cassette. | | | | | | | |
| 8 | B | B | X | X | X | X | X |

TABLE 14-continued

| | Conventional Wafer Processing Cycle | | | | | | |
|---|---|---|---|---|---|---|---|
| 9 | B | B | B | X | X | X | X |
| 10 | B | B | B | B | X | X | X |
| 11 | B | B | B | B | X | B | X |
| 12 | B | B | B | B | X | B | B |

*Wafer returning to IND waits for five cycles.

As clearly seen in Table 14, retrieving of a substrate from the subsequent lot B is suspended for five cycles after retrieving of the last substrate from the precedent lot A, and therefore, a wait time is five cycles longer than in the flex flow processing shown in Table 13.

Table 15 compares the through puts between the wafer cycles of Table 13 and that of Table 14.

TABLE 15

| | Improvement in Through Put | |
|---|---|---|
| | The number of cycles during which retrieving must be restricted | Time loss | Through put in repeated successive processing |
| Conventional | 5 | 300 sec | 50 substrates/hour |
| Flex Flow | 0 | 0 | 60 substrates/hour |

As clearly seen in Table 15, the through put of the flex flow processing in which 60 substrates are processed per hour is 1.2 times as high as the through put of the conventional processing in which 50 substrates are processed per hour. The figures listed in Table 15 are calculated on a premise that 25 substrates 30 are contained in each one of the lots A and B, the tact time is equally 60 seconds, and that the lots A and B are infinitely loaded one after another.

Figure 18:
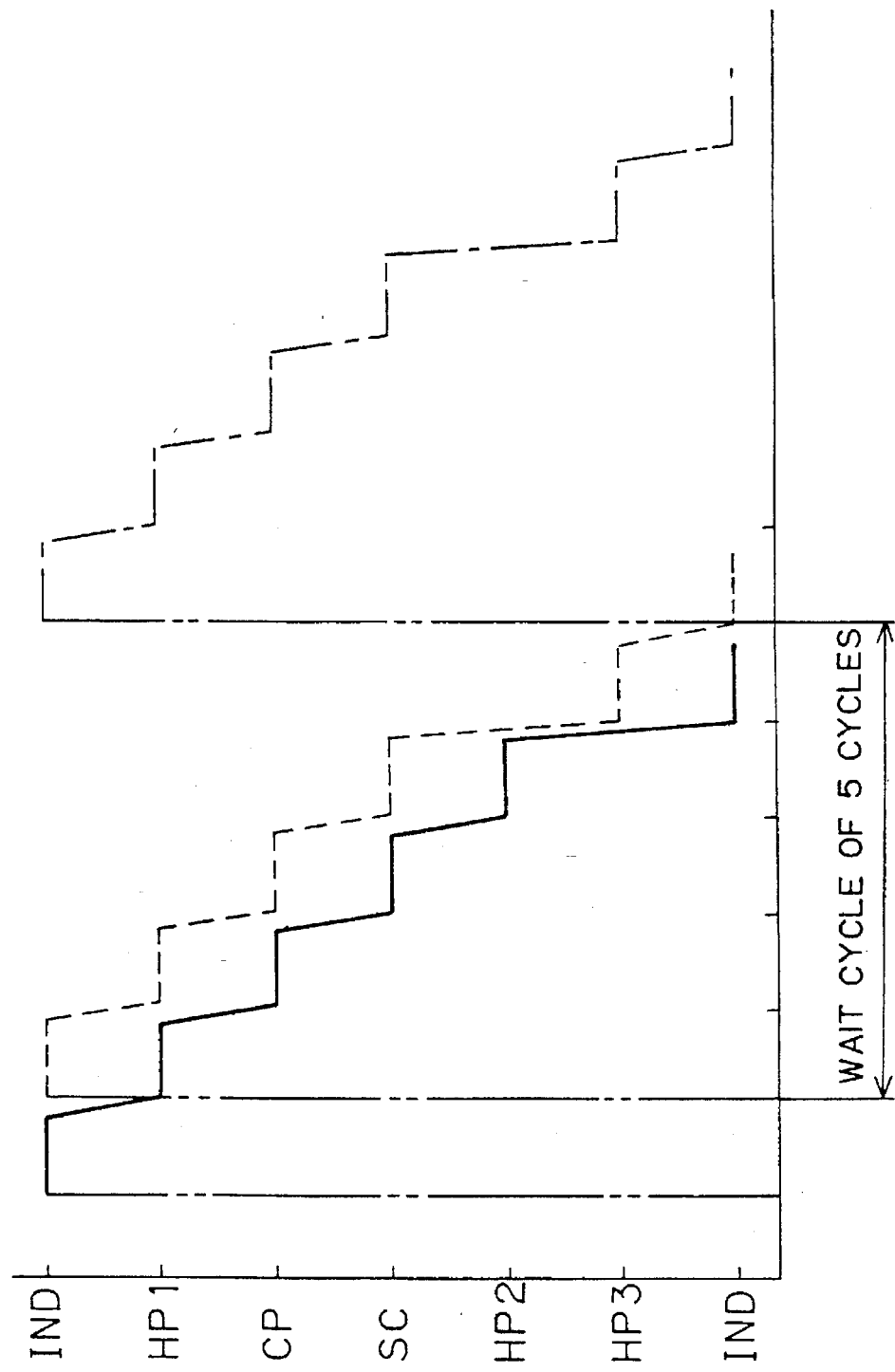
FIG. 18 is a graph of a tact priority flex flow processing.

FIG. 18 shows a specific example of the flows and timing in the wafer processing of Tables 13 and 14. The horizontal axis expresses time, i.e., cycles while the vertical axis denotes the substrate processing parts (or units). The processing timing of the last substrate 30 of the precedent lot A is indicated by the solid line. The dotted line indicates the processing timing of the first substrate 30 of the lot B which is retrieved after flex flow processing. The dotted-and-dashed line indicates the processing timing of the first substrate 30 of the subsequent lot B in the conventional apparatus. FIG. 18 clearly shows that five wait cycles are created in the conventional processing indicated by the dotted-and-dashed line, whereas there is no wait cycle created in the flex flow processing by the first preferred embodiment.

Table 16 shows wafer processing cycles during a transition from one flow to another different flow where the apparatus successively processes the substrates of the pair of the lots A and B of Table 5 having different flows from each other.

TABLE 16

| | Wafer Processing Cycle in Flex Flow Processing | | | | | |
|---|---|---|---|---|---|---|
| Lot A | (1) IND | (2) HP1 | (3) CP | (4) SC | (5) HP2 | (6) IND |
| Lot B | (1) | | | (2) | (3) | (4) |
| Processing Cycle | | | | | | |
| 1 | X | [A] | A | A | A | A |
| 2 | X | X | [A] | A | A | A |
| 3 | B | X | X | [A] | A | A |
| *Lot B is started after two wafers. | | | | | | |
| 4 | B | X | X | B | [A] | A |
| 5 | B | X | X | B | B | [A] |
| *Cassette end wafer [A] is transferred to IND. | | | | | | |
| 6 | B | X | X | B | B | B |
| *Wafer of lot B is transferred to IND without a break between cycles. | | | | | | |

As clearly seen in Table 16, the substrates of the lots A and B having different flows are processed successively without a break. However, retrieving of a substrate from the subsequent lot B must wait for two cycles because of a difference in the processing position and a difference in the flow steps.

Table 17 below shows wafer processing cycles of the conventional apparatus during successive processing of the substrates of the pair of the lots A and B of Table 5 having different flows from each other.

TABLE 17

| | Conventional Wafer Processing Cycle | | | | | |
|---|---|---|---|---|---|---|
| Lot A | (1) IND | (2) HP1 | (3) CP | (4) SC | (5) HP2 | (6) IND |
| Lot B | (1) | | | (2) | (3) | (4) |
| Processing Cycle | | | | | | |
| 1 | X | [A] | A | A | A | A |
| 2 | X | X | [A] | A | A | A |
| 3 | X | X | X | [A] | A | A |
| 4 | X | X | X | X | [A] | A |
| 3 | X | X | X | X | X | [A] |
| *Cassette end wafer [A] is transferred to IND. | | | | | | |
| 6 | B | X | X | X | X | X |
| *Lot B is started after the cassette end wafer is returned to the cassette. | | | | | | |
| 7 | B | X | X | B | X | X |
| * Wafer skips HP1/CP1 and is loaded into SC. | | | | | | |
| 8 | B | X | X | B | B | X |
| 9 | B | X | X | B | B | B |
| * Wafer returning to IND waits for three cycles. | | | | | | |

As clearly seen in Table 17, a wait time is three cycles longer than in the flex flow processing as it is shown in Table 16 since retrieving of a substrate from the subsequent lot B must wait for five cycles. If the order of the cassettes is reverse, no wait time is created in the first preferred embodiment whereas a wait time of three cycles is created in the conventional apparatus.

Table 18 below compares the through puts between the wafer cycles of Table 13 and that of Table 14.

TABLE 18

|  | The number of cycles during which retrieving must be restricted | Time loss (per cassette) | Through put in repeated successive processing |
|---|---|---|---|
| Conventional | 5 | 300 sec | 50.8 substrates/hour |
| Flex flow | 2 | 120 sec | 57.7 substrates/hour |

Table 18 clearly shows that the through put of the flex flow processing in which 57.7 substrates are processed per hour is 1.14 times as high as the through put of the conventional processing in which 50.8 substrates are processed per hour. The figures listed in Table 18 are calculated on a premise that 25 substrates 30 are contained in each one of the lots A and B, the tact time is equally 60 seconds, and that the lots A and B are infinitely loaded one after another.

Table 19 below shows wafer processing cycles during a transition from one flow to another different flow of the apparatus of the first preferred embodiment where the apparatus successively processes the substrates contained the pair of the lots A and B of Table 11 having different flows. The wafer flow of the lot A includes concurrent processing.

TABLE 19

Wafer Processing Cycle Including Concurrent Processing

| | | | | | | | | | $W_n = 5$ |
|---|---|---|---|---|---|---|---|---|---|
| Lot A | (1) | (2) ((4)) | (2) ((4)) | (2) ((4)) | (3) | (4) | (5) | (6) | (7) |
| | IND (L) | a | b | c | d | e | f | g | IND (UL) |
| Lot B | (1) | (5) | | | | (4) | (2) | (3) | (6) |

| Processing Cycle | | | | | | | | | |
|---|---|---|---|---|---|---|---|---|---|
| 1 | X | A | A | [A] | A | A | A | A | A |
| * 2 | X | X | A | [A] | A | A | A | A | A |
| 3 | X | X | X | [A] | A | A | A | A | A |
| 4 | X | X | X | X | [A] | A | A | A | A |
| 5 | X | X | X | X | X | [A] | A | A | A |
| 6 | B | X | X | X | X | X | [A] | A | A |
| * 7 | B | X | X | X | X | X | B | [A] | A |
| 8 | B | X | X | X | X | X | B | B | [A] |
| 9 | B | X | X | X | X | B | B | B | X |
| 10 | B | B | X | X | X | B | B | B | X |
| 11 | B | B | X | X | X | B | B | B | B |
| 12 | B | B | X | X | X | B | B | B | B |

As clearly seen in Table 19, retrieving of a substrate from the subsequent lot B is suspended for five cycles during successive processing of the lots A and B. Thus, a wait time is two cycles shorter in the first preferred embodiment than in the conventional apparatus in which a wait time lasts for seven cycles. Table 20 below shows wafer processing cycles of the conventional apparatus during successive processing of the substrates contained in the pair of the lots A and B of Table 12 having different flows. Between Tables 19 and 20, the flow step of one of the lots is replaced with that of the other. The wafer flow of the lot B includes concurrent processing. The symbol [B] expresses that the last substrate includes concurrent processing. The symbol [B] expresses that the last substrate 30 of the lot B is present.

TABLE 20

Wafer Processing Cycle Including Concurrent Processing

| | | | | | | | | | $W_n = 3$ |
|---|---|---|---|---|---|---|---|---|---|
| Lot A | (1) IND (L) | (5) a | b | c | d | (4) e | (2) f | (3) g | (6) IND (UL) |
| Lot B | (1) | (2) | (2) | (2) | (3) | (4) | (5) | (6) | (7) |

| Processing Cycle | | | | | | | | | |
|---|---|---|---|---|---|---|---|---|---|
| 1 | X | B | X | X | X | B | [B] | B | B |
| * 2 | X | B | X | X | X | B | X | [B] | B |
| 3 | X | B | X | X | X | [B] | X | X | B |
| 4 | A | [B] | X | X | X | X | X | X | B |
| * 5 | A | A | X | X | X | X | X | X | [B] |
| 6 | A | A | A | X | X | X | X | X | X |
| 7 | A | A | A | A | X | X | X | X | X |
| 8 | A | A | A | A | A | X | X | X | X |

Table 20 clearly shows that retrieving from the subsequent lot B is suspended for three cycles during successive processing of the lots A and B. Thus, a wait time is one cycle shorter in the first preferred embodiment than in the conventional apparatus in which a wait time lasts for four cycles.

The flex flow processing described above is related to where the substrate processing parts (or units) do not include an interface buffer, a device which serves as an interface with an external device such as a stepper which is externally connected to the substrate processing apparatus. In general, an external device such as a stepper operates with its own special cycle time which is different from the tact time of the substrate processing apparatus of the present invention, and therefore, tact management is impossible. Hence, when a wafer flow which includes an interface buffer is to be followed by another wafer flow, tact management of the wafer flow of the subsequent wafer flow is impossible. To deal with this, the loading wait cycle W is calculated as in the flex flow processing with respect to both the wafer flow of the precedent lot A and that of the subsequent lot B after the interface buffer (See FIGS. 14 and 15) to make it possible to perform tact management of the wafer flow of the subsequent lot. Calculation of the loading wait cycle W is performed with the interface buffer replaced with the indexer IND which unloads the substrates 30. In this case, tact management is started when processing of the wafer flow of the precedent lot up to the interface buffer completely ends and when retrieving of the last substrate from the precedent lot A by the interface buffer completes. The loading wait cycle W is then calculated and the subsequent lot B is processed after suspended, or the subsequent lot B is processed after suspended in accordance with a preliminarily calculated loading wait cycle W.

Table 21 shows an example of the wafer flows of the pair of the lots A and B.

TABLE 21

| Lot A | IND (L) | SC | HP1 | CP1 | (1) IF-B | (2) DEV | (3) HP2 | (4) CP2 | | | (5) IND (UL) |
|---|---|---|---|---|---|---|---|---|---|---|---|
| Lot B | | | | | (1) IND (L) | | (2) HP2 | (3) CP2 | (4) SC | (5) HP3 | (6) CP3 | (7) IND (UL) |

The wafer flow of the precedent lot A includes a treatment (IF-B) at the interface buffer and a treatment (DEV) at the spin developer SD. In this example, Processing Position Difference Pd=0, Flow Step Difference $F_{sm}=1$, and Maximum Flow Step Difference Fs=1. Hence, the loading wait cycle W at successive loading from the subsequent lot B is, Loading Wait Cycle W=1.

In the flex flow processing as above, when the precedent lot A is to undergo concurrent processing, new flow steps are defined by adding the value (the number of concurrent processing–1) with respect to the substrate processing parts (or units) performing concurrent processing, thereby preventing contention between processing of a substrate of the subsequent lot B and processing of a substrate of the precedent lot A at the substrate processing parts (or units) in which concurrent processing is performed. It is to be noted that this is a countermeasure assuming the worst scenario. For instance, it is possible that the last substrate 30 of the precedent lot A is not to be processed in a certain substrate processing part (or unit) in which the substrates of the subsequent lot B is processed. In this case, in terms of circulating transportation, the second last or the previous substrate of the precedent lot A is virtually the last substrate of the lot A. Hence, the flow step difference $F_{sm}$ is calculated noting the nature of this substrate processing part (or unit) (Specifically, values (the number of concurrent processing–2), (the number of concurrent processing–3), . . . are added to the flow steps.). As a result, the loading wait cycle W is shortened as a whole. Even when principally the earlier substrates of the subsequent lot B are to be processed concurrently, it is possible to reduce the flow step difference $F_{sm}$ and shorten the overall loading wait cycle W in the same manner as above.

Table 22 below shows wafer flows including concurrent processing as above.

TABLE 22

```
              ┌─ a ─┐
Flow of   IND ── b    ── e ── f ── g ────── IND
Lot A     (L)    └─ c ─┘                    (UL)

Flow of   IND ── a ── b ── e ── f ── g ── IND
Lot B     (L)                              (UL)
```

In Table 22, the wafer flow of the precedent lot A includes concurrent processing. That is, treatments a, b and c on substrates of the lot A are performed concurrently.

In accordance with the calculation method as that of FIGS. 14 and 15, Loading Wait Cycle W=2 when the substrates of the pair of the lots A and B are processed successively. On the other hand, when the last substrate 30 of the lot A is to be processed in the substrate processing parts (or units) which is in charge of the treatment c, the loading wait cycle W is shortened since possible contention during the treatment a is caused by the second last or the previous substrate 30.

Figure 19:
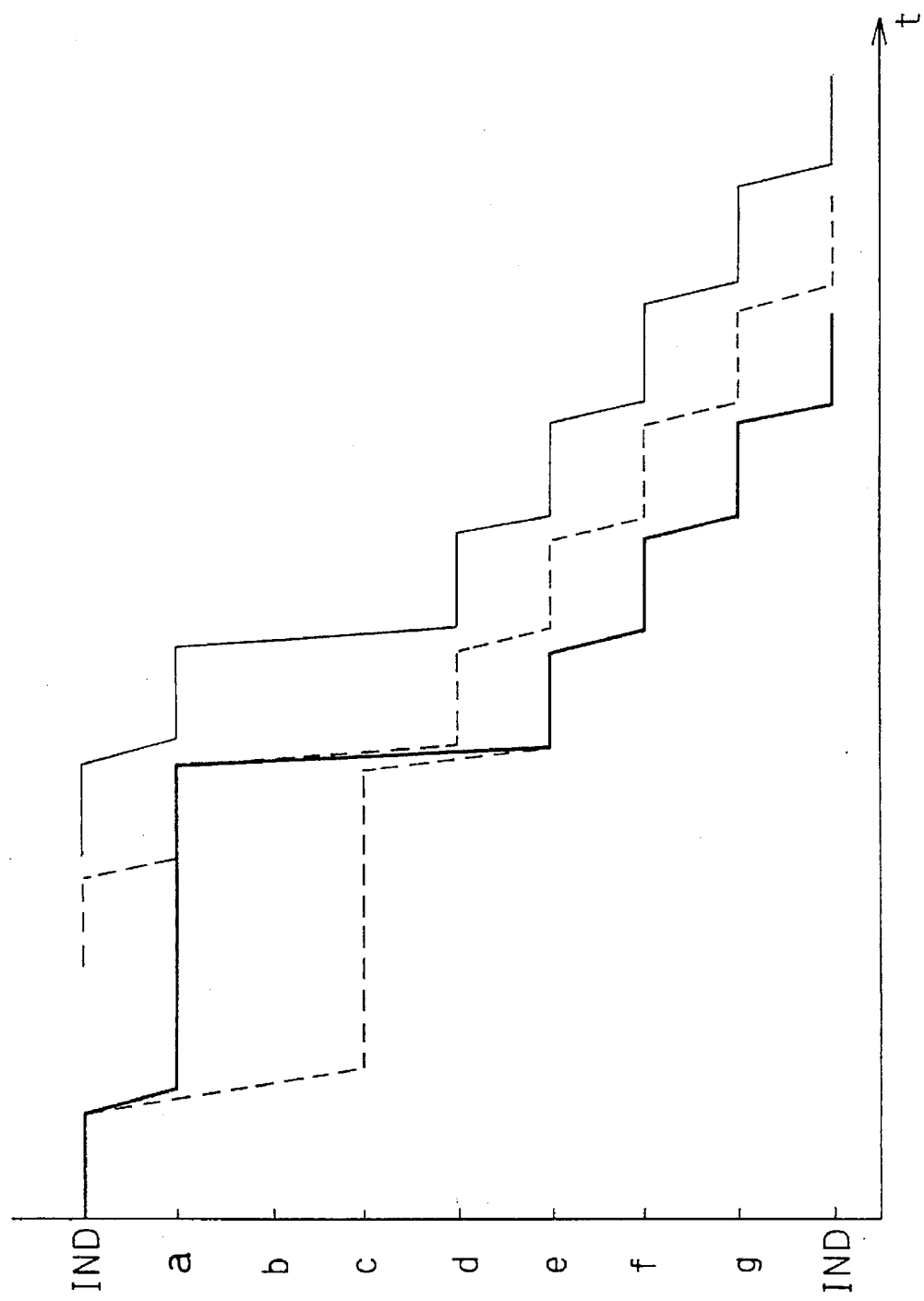
FIG. 19 is a graph of a modified version of a tact priority flex flow processing.

FIG. 19 shows a specific example of the flow and the timing of the wafer processing of Table 22. The horizontal axis expresses time, i.e., cycles while the vertical axis denotes the substrate processing parts (or units). In FIG. 19, the solid line expresses a case where the loading wait cycle W is calculated in the calculation method as that of FIGS. 14 and 15, while the dotted line expresses a case where the lots A and B are linked to each other most efficiently. As clearly shown in FIG. 19, retrieving of a substrate from the subsequent lot B is advanced one cycle.

Now, an operation of the substrate processing apparatus performing through put priority flex flow processing will be described. Except for the absence of tact management, through put priority flex flow processing is the same as tact priority flex flow processing. Hence, the operation of through put priority flex flow processing is virtually the same as that shown in FIG. 13. Since the only difference is transportation and the like (Step S203), only Step S203 will be described below.

Figure 20:
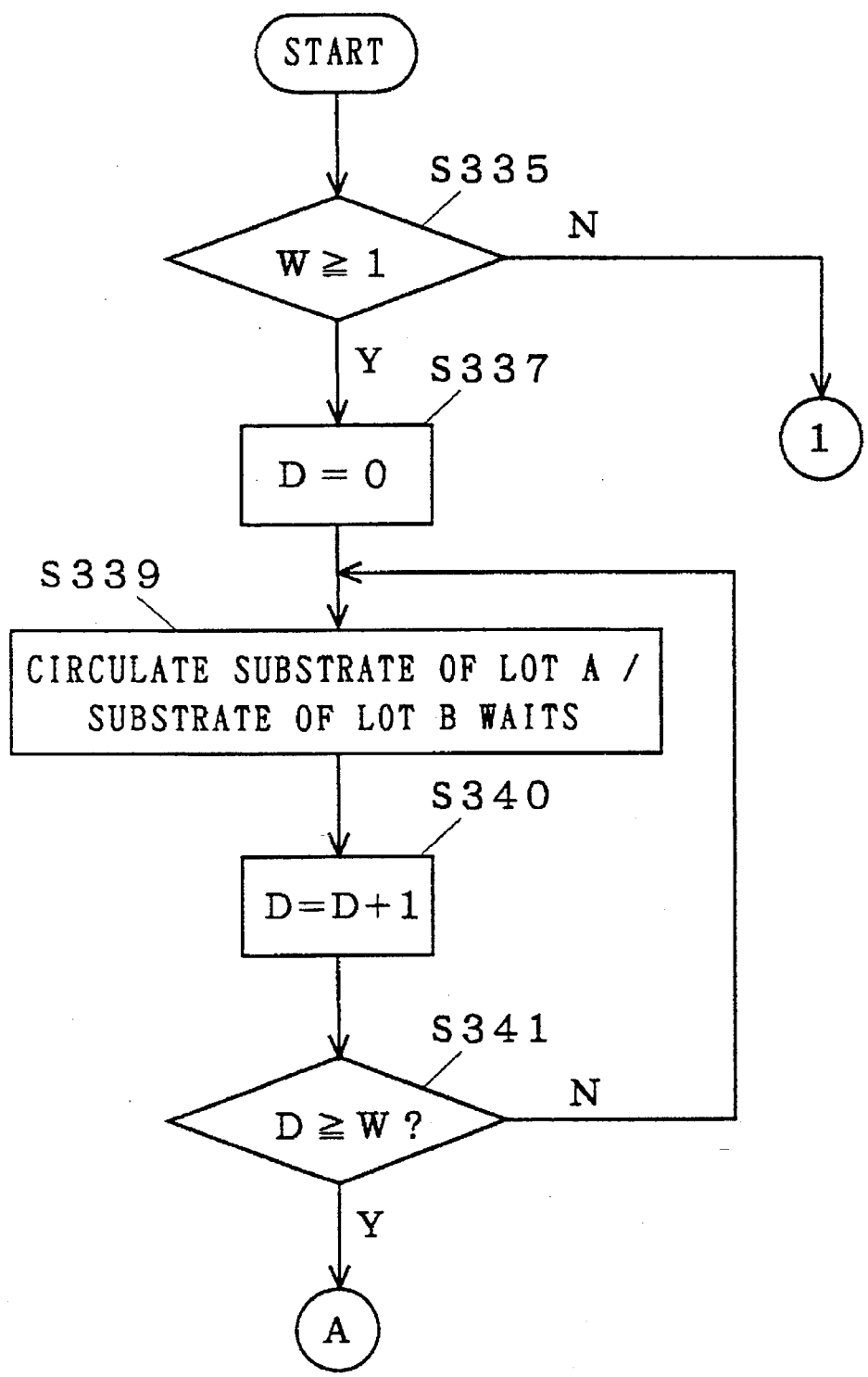
FIGS. 20 and 21 are flow charts showing of a through put priority flex flow processing.
Figure 21:
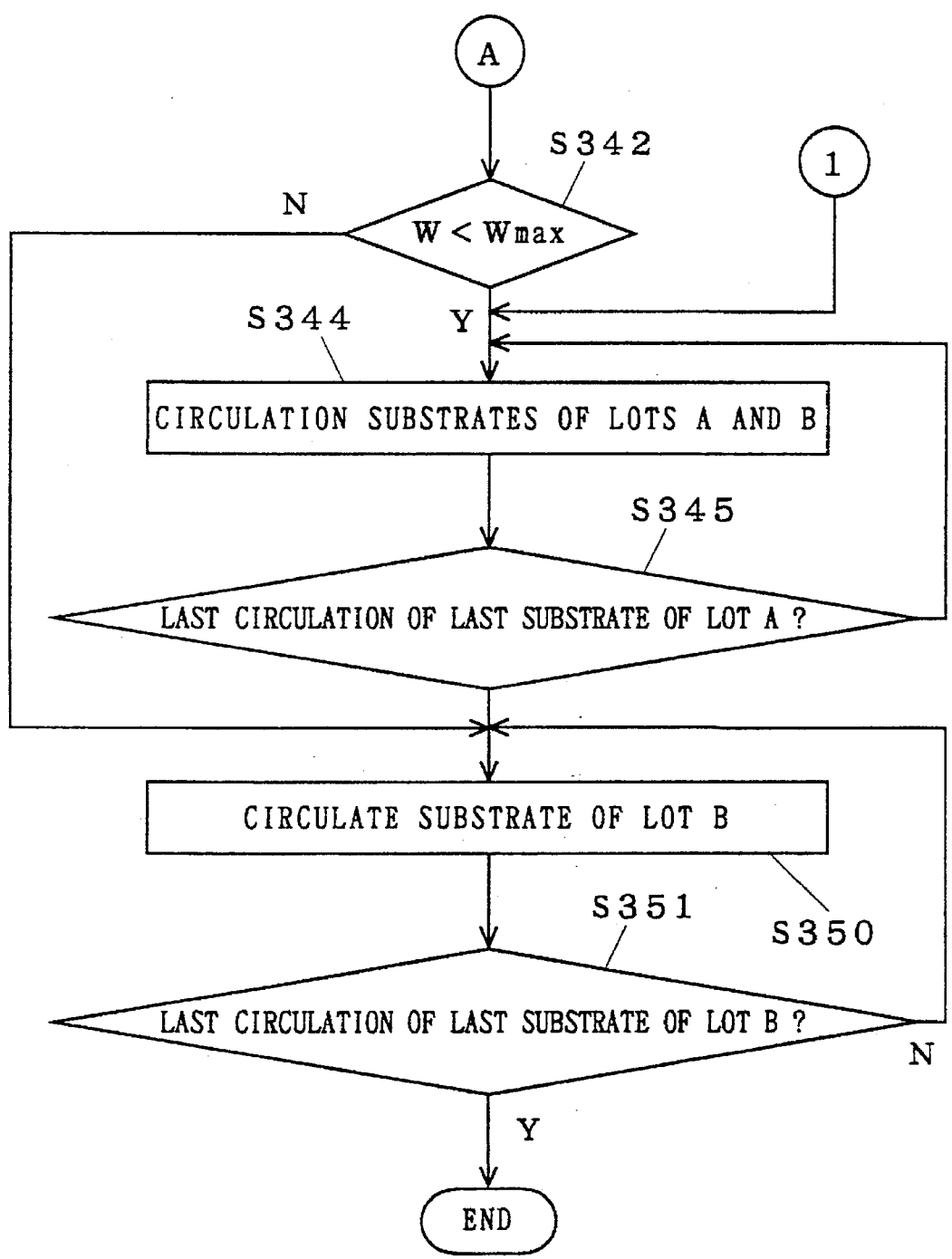

FIGS. 20 and 21 are flow chart showing Step S203 in detail.

First, whether a loading wait cycle W is equal to or larger than 1 is judged (Step S335). If it is judged at Step S335 that the loading wait cycle W is equal to or larger than 1 so that retrieving of a substrate from the lot B is to be restricted, a count D registered by the counter is reset as D=0 to an initial state (Step S337). Next, one cycle of circulating transportation of the substrates 30 of the lot A is started (Step S339), thereby suspending the lot B in a waiting state. The registered count D is then incremented by 1 (Step S340), and it is judged whether the count D is equal to or larger than the loading wait cycle W (Step S341). If NO, the sequence returns to Step S339. This is repeated to process the last substrate 30 of the lot A.

If it is judged at Step S341 that the count D is equal to or larger than the loading wait cycle W, the substrates 30 of the lot B are released from the waiting state. Whether the loading wait cycle W is shorter than the standard wait cycle Wmax is then judged (Step S342). If YES, one cycle of circulating transportation of the substrates 30 of the lots A and B is started (Step S344). Next, it is judged whether the current circulating transportation is the last cycle of circulating transportation of the last substrate 30 of the lot A (Step S345). If NO, the sequence returns to Step S344. This is repeated to serially process the substrates 30 of the lots A and B.

If the last cycle of circulating transportation of the last substrate 30 of the lot A is detected at Step S345, the transport robot 10 starts one cycle of circulating transportation of the remaining substrates 30 of the lot B (Step S350). Next, it is judged whether the current circulating transportation is the last cycle of circulating transportation of the last substrate 30 of the lot B (Step S351). Since NO, the sequence returns to Step S350. This is repeated to serially process the remaining substrates 30 of the lot B. The sequence is ended upon detection of the last cycle of circulating transportation of the last substrate 30 at Step S351.

If it is judged at Step S335 that the loading wait cycle W is smaller than 1 (that is, equal to 0) so that loading from the lot B is not to be restricted, the sequence proceeds to Step S344, starting one cycle of circulating transportation of the remaining substrates 30 of the lot A and the first substrate 30 of the lot B. Next, Step S345 is executed to judge whether the current circulating transportation is the last cycle of circulating transportation of the last substrate 30 of the lot A. If NO, the sequence returns to Step S344. This is repeated until the last cycle of circulating transportation of the last substrate 30 of the lot A is detected. Upon detection of the last cycle, Steps S350 and S351 are repeated to process the remaining substrates 30 of the lot B.

If it is found at Step S342 that the loading wait cycle W is equal to Wmax, assuming that retrieving from the lot B is to be restricted until the processing of the lot A completes, the sequence proceeds to Step S350 to continue the processing of the substrates 30 of the lot B.

Although the foregoing has described the few preferred embodiments, the present invention is not limited to these particular embodiments.

For instance, although substrates of two lots having different flows from each other are concurrently processed in the embodiments above, it is possible to concurrently process substrates of three or more lots which have different flows from each other. It is also possible to alternately repeat different flows at a certain repeating ratio.

Further, if there is no common position between the wafer flows of different lots, double flow processing is possible independently of a difference between the number of flow steps of the wafer flows. Double flow processing promises a better through put than flex flow processing (i) if it is necessary to successively process substrates of lots between which the numbers of flow steps of wafer flows are different, (ii) or if it is necessary to successively process substrates of a lot whose tact time is restricted by a processing time and substrates of a lot whose tact time is restricted by a transportation time of the transport robot 10, (iii) or if it is necessary to successively process substrates of lots whose tact times are both restricted by a processing time, (iv) or if it is necessary to successively process substrates of a lot whose wafer flow inches an interface buffer and substrates of a lot whose wafer flow does not include an interface buffer. This is because a loading wait time increases in flex flow processing. For instance, when the substrate processing apparatus of the present invention may be a single block in-line type apparatus whose floor space is small (This type of apparatus includes only one transport robot.). Assuming that the apparatus is not connected to an exposure device and coating and developing must be concurrently performed, since the substrate processing apparatus of the present invention can perform double flow processing, the through put does not drop. In contrast, the through put drops to half in the conventional apparatus under the same condition.

In addition, although the contents of the wafer flow of the subsequent lot are inputted after starting a circulation of an already retrieved substrate of the precedent lot which has a different flow from that of the subsequent flow and the contents of double flow or flex flow processing are thereafter determined, this may be changed. The contents of the wafer flows of the lots having different flows from each other may be inputted in advance and the contents of double flow or flex flow processing may be then determined. The substrates 30 of the lots may be thereafter circulated.

The loading wait cycle W may not be equal to the processing position difference Pd or the maximum flow step difference Fs in flex flow processing. That is, a substrate of one lot never passes a substrate of another lot when the loading wait cycle W is larger than the maximum flow step difference Fs or the processing position difference Pd, which never allows interference between substrates of these two lots. On the other hand, if the loading wait cycle W is shorter than the standard wait cycle (the wait cycle in the conventional method), the through put is improved.

Further, although the preferred embodiments above use the longer one of different tact times of two successive lots which are within the apparatus, this may not be necessary. For instance, if the tact time of the precedent lot is longer, the tact time of the subsequent lot may be adjusted to be the same as the tact time of the precedent lot. In this case, however, the two lots must be processed in a range in which the effect created by extending the tact time and setting the loading wait cycle shorter than the standard wait cycle is not be eliminated. Meanwhile, if the two successive lots have the same tact time, it is possible to process the two lots both in a constant cycle time, or a tact time.

In addition, although the foregoing has described the present invention as related only to successive processing of substrates having different flows (i.e., wafer flows), the present invention is also applicable to successive processing of different recipes in which various process data such as a processing temperature, a processing time, a rotation number and a processing fluid as well as through puts are different although the wafer flows are the same. Even in such successive processing, the through put is improved by appropriately delaying the retrieving timing of a subsequent lot in each cycle.

While the invention has been described in detail, the foregoing description is in all aspects illustrative and not restrictive. It is understood that numerous other modifications and variations can be devised without departing from the scope of the invention.

We claim:

1. A substrate processing apparatus for processing a precedent and a subsequent lot each of which is formed by a plurality of substrates, comprising:

a plurality of first processing parts each of which processes said substrates of said precedent lot one by one;

a plurality of second processing parts each of which processes said substrates of said subsequent lot one by one;

transport means for circulating among said first processing parts while holding said substrates of said precedent lot to perform circulating transportation for said precedent lot, thereby to process said substrates of said precedent lot by first processing and circulating among said second processing parts while holding said substrates of said subsequent lot to perform circulating transportation for said subsequent lot, thereby to process said substrates of said subsequent lot by second processing, said transport means being capable of carrying only single substrate at the same time from one of said plurality of first or second processing parts to another; and double flow control means for controlling said transport means to perform double flow processing in which said circulating transportation for said precedent and subsequent lots are performed by repetition of unit circulation which circulates among said first or second processing parts, and in which said circulating transportation for said precedent lot is interrupted after starting of the circulating transportation of the first substrate of said precedent lot before starting of the circulating transportation of the last substrate of said precedent lot and then at least one unit circulation of said circulating transportation for said subsequent lot is performed.

2. The substrate processing apparatus of claim 1, further comprising:

flex flow control means for controlling said transport means to perform flex flow processing in which circulating transportation for said subsequent lot is started after starting of the circulating transportation of the substrate of said precedent lot before the completion of the first processing under the condition that interference between the first and second processing is prohibited; and selection means for selecting one flow processing out of said double and flex flow processing, such that said substrates are transported in the selected flow processing.

3. A method of processing substrates of precedent and subsequent lots, comprising the steps of:

preparing a plurality of first processing parts each of which processes said substrates of said precedent lot;

preparing a plurality of second processing parts each of which processes said substrates of said subsequent lot;

transporting said substrates of said precedent lot circulating among said first processing parts while processing said substrates of said precedent lot by said first processing parts, thereby to process by first processing; and transporting said substrates of said subsequent lot circulating among said second processing parts while processing said substrates of said subsequent lot by said second processing parts, wherein each of said steps of transporting said substrates of said precedent and subsequent lots are performed by carrying only single substrate at the same time from one of said plurality of first or second processing parts to another, and said substrates are transported in double flow processing in which circulating transportations for said precedent and subsequent lots are performed by repetition of unit circulation which circulates among said first or second processing parts, and in which said circulating transportation for said precedent lot is interrupted after starting of the circulating transportation of the first substrate of said precedent lot before starting of the circulating transportation of the last substrate of said precedent lot and then at least one unit circulation of said circulating transportation for said subsequent lot is performed.

4. The method of claim 3, further comprising the step of selecting one flow processing out of said double flow processing and flex flow processing in which circulating transportation for said subsequent lot is started after starting of the circulating transportation of a substrate of said precedent lot before the completion of the first processing under the condition that interference between the first and second processing is prohibited, and wherein said substrates are transported in selected flow processing.

5. A method of processing substrates of precedent and subsequent lots, comprising the steps of:

preparing a plurality of first processing parts each of which processes said substrates of said precedent lot;

preparing a plurality of second processing parts each of which processes said substrates of said subsequent lot;

transporting said substrates of said precedent lot circulating among said first processing parts while processing said substrates of said precedent lot by said first processing parts;

judging whether first cycle time required for processing said substrates of said subsequent lot by said second processing parts is ended; and when it is judged that the first cycle time is ended, interrupting the transportation of said substrates of said precedent lot and then transporting said substrates of said subsequent lot circulating among said second processing parts while processing said substrates of said subsequent lot by said second processing parts, wherein each of transportations of said substrates of said precedent and subsequent lots is performed by carrying only single substrate at the same time from one of said plurality of first or second processing parts to another, and said transportations for said precedent and subsequent lots are performed by repetition of unit circulation which circulates among said first or second processing parts.

6. The method of claim 5, further comprising the steps of:

judging whether second cycle time required for processing said substrates of said precedent lot by said first processing parts is ended; and when it is judged that the second cycle time is ended, interrupting the transportation of said substrates of said subsequent lot and then transporting said substrates of said precedent lot among said first processing parts while processing said substrates of said precedent lot by said first processing parts.

7. The substrate processing apparatus of claim 1, wherein said double flow processing is performed in such a manner that integer numbers Tca and Tcb are calculated, unit circulation for said precedent lot is performed Tca times within interval of successive two unit circulations for said subsequent lot when Tca is not smaller than 1, and unit circulation for said subsequent lot is performed Tcb times within interval of successive two unit circulations for said precedent lot when Tcb is not smaller than 1, wherein said integer number Tca is defined as INT(Wb/Ta)+1, Wb being said interval of successive two unit circulations for said subsequent lot, Ta being period of repetition of unit circulation for said precedent lot, and said integer number Tcb is defined as INT(Wa/Tb)+1, Wa being said interval of successive two unit circulations for said precedent lot, Tb being period of repetition of unit circulation for said subsequent lot.

8. The method of processing substrates of claim 3, wherein said double flow processing is performed in such a manner that integer numbers Tca and Tcb are calculated, unit circulation for said precedent lot is performed Tca times within interval of successive two unit circulations for said subsequent lot when Tca is not smaller than 1, and unit circulation for said subsequent lot is performed Tcb times within interval of successive two unit circulations for said precedent lot when Tcb is not smaller than 1, wherein said integer number Tca is defined as INT(Wb/Ta)+1, Wb being said interval of successive two unit circulations for said subsequent lot, Ta being period of repetition of unit circulation for said precedent lot, and said integer number Tca is defined as INT(Wa/Tb)+1, Wa being said interval of successive two unit circulations for said precedent lot, Tb being period of repetition of unit circulation for said subsequent lot.

9. The substrate processing apparatus of claim 1, wherein said double flow processing is performed in such a manner that remaining processing times TPa and TPb are calculated immediately before each unit circulation starts, and a following unit circulation, next to said each one is performed for said precedent lot when TPa≦0 and TPb>0, for subsequent lot when TPa>0 and TPb≦0, and for the other lot than said each one when TPa and TPb≦0 or TPa and TPb>0, wherein said remaining processing time TPa is defined as a maximum value of a quantity TPa(n) for all integers n which identify said plurality of first processing parts, each TPa(n) being obtained by subtracting, from remaining time until completion of processing at a first processing part identified by an integer n, a time needed for executing said each unit circulation and a time from starting of said following unit circulation for said precedent lot up to removing a substrate from a first processing part identified by said integer n within said following one, and said remaining processing time TPb is defined as a maximum value of a quantity TPb(m) for all integers m which identify said plurality of second processing parts, each TPb(m) being obtained by subtracting, from remaining time until completion of processing at a second processing part identified by an integer m, a time needed for executing said each unit circulation and a time from starting of said following unit circulation for said subsequent lot up to removing a substrate from a second processing part identified by said integer m within said following one.

10. The method of processing substrates of claim 3, wherein said double flow processing is performed in such a manner that remaining processing times TPa and TPb are calculated immediately before each unit circulation starts, and a following unit circulation, next to said each one, is performed for said precedent lot when TPa≦0 and TPb>0, for subsequent lot when TPa>0 and TPb≦0, and for the other lot than said each one when TPa and TPb≦0 or TPa and TPb>0, wherein said remaining processing time TPa is defined as a maximum value of a quantity TPa(n) for all integers n which identify said plurality of first processing parts, each TPa(n) being obtained by subtracting from remaining time until completion of processing at a first processing part identified by an integer n, a time needed for executing said each unit circulation and a time from starting of said following unit circulation for said precedent lot up to removing a substrate from a first processing part identified by said integer n within said following one, and said remaining processing time TPb is defined as a maximum value of a quantity TPb(m) for all integers m which identify said plurality of second processing parts, each TPb(m) being obtained by subtracting from remaining time until completion of processing at a second processing part identified by an integer m, a time needed for executing said each unit circulation and a time from starting of said following unit circulation for said subsequent lot up to removing a substrate from a second processing part identified by said integer m within said following one.

11. The substrate processing apparatus of claim 2, further comprising, referring to said selection means as a first selection means, a second selection means for selecting one, during said circulating transportation for said precedent lot, out of continuing said circulating transportation for said precedent lot and starting the selection by said first selection means, in accordance with a judge whether there is any obstruction to start said circulating transportation for said subsequent lot or not.

12. The method of processing substrates of claim 4, further comprising a step of selecting one, during transporting said substrate of said precedent lot, out of continuing to transport said substrates of said precedent lot and starting said step of selecting one flow processing, in accordance with a judge whether there is any obstruction to start said circulating transportation for said subsequent lot or not.

13. The substrate processing apparatus of claim 2, further comprising, referring to said selection means as a first selection means, a second selection means for selecting one to be started, during said circulating transportation for said precedent lot, out of a stopping mode, a waiting mode, an inquiring mode, and a continuing mode, in accordance with a judge whether there is any obstruction to start said circulating transportation for said subsequent lot or not, said stopping mode being defined as an operation mode in which said circulating transportation for said precedent lot is continued without interruption until processing on a last substrate of said precedent lot is completed, and is not succeeded by said circulating transportation for said subsequent lot, said waiting mode being defined as an operation mode in which said circulating transportation for said precedent lot is continued without interruption until processing on a last substrate of said precedent lot is completed, and is succeeded by said circulating transportation for said subsequent lot, said inquiring mode being defined as an operation mode in which an inquiry of an operator is made about which one to be selected out of said stopping mode, said waiting mode, and said continuing mode, and then selected mode is started, and said continuing mode being defined as an operation mode in which a selection by said first selection means is performed.

14. The method of processing substrates of claim 4, further comprising a step of selecting one to be started, during transporting said substrates of said precedent lot, out a step of stopping, a step of waiting, a step of inquiring, and said step of selecting one flow processing, in accordance with a judge whether there is any obstruction to start said circulating transportation for said subsequent lot or not, said step of stopping being defined as a step in which said circulating transportation for said precedent lot is continued without interruption until processing on a last substrate of said precedent lot is completed, and is not succeeded by said circulating transportation for said subsequent lot, said step of waiting being defined as a step in which said circulating transportation for said precedent lot is continued without interruption until processing on a last substrate of said precedent lot is completed, and is succeeded by said circulating transportation for said subsequent lot, and said step of inquiring being defined as a step in which an inquiry of an operator is made about which one to be selected out of said stopping mode, said waiting mode, and said continuing mode, and then selected mode is started.

15. The substrate processing apparatus of claim 2, wherein said flex flow control means selectively performs one of a tact priority processing and a through put priority processing in accordance with selection by an operator, said tact priority processing being a processing in which repetition periods of unit circulation for said precedent lot and said subsequent lot are respectively held constant during said flex flow processing, and said through put priority processing being a processing in which repetition periods of unit circulation for said precedent lot and said subsequent lot are respectively so determined so as to minimize a through put during said flex flow processing regardless of constancy of each of said periods.

16. The method of processing substrates of claim 4, wherein said flex flow processing is performed with priority selectively on one of a tact time and a through put in accordance with selection by an operator, wherein, in said flex flow processing with said priority on said tact time, repetition periods of unit circulation for said precedent lot and said subsequent lot are respectively held constant, and in said flex flow processing with said priority on said through put, repetition periods of unit circulation for said precedent lot and said subsequent lot are respectively so determined as to minimize a through put regardless of constancy of each of said periods.

* * * * *